(12) United States Patent
Noda

(10) Patent No.: US 6,437,899 B1
(45) Date of Patent: Aug. 20, 2002

(54) OPTO-ELECTRIC CONVERSION SEMICONDUCTOR DEVICE

(75) Inventor: Masaki Noda, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 168 days.

(21) Appl. No.: 09/643,248

(22) Filed: Aug. 22, 2000

(30) Foreign Application Priority Data

Nov. 15, 1999 (JP) ............................................ 11-323812
Mar. 8, 2000 (JP) ........................................ 2000-063195

(51) Int. Cl.[7] ............................ G02F 1/03; H01L 29/40
(52) U.S. Cl. ...................... 359/245; 359/237; 359/238; 257/728
(58) Field of Search ................................ 359/245, 237, 359/239, 238; 257/728, 664, 690

(56) References Cited

U.S. PATENT DOCUMENTS 6,359,720 B1 * 3/2002 Yamada ...................... 359/245
2001/0038146 A1 * 11/2001 Shimizu ........................ 29/40

FOREIGN PATENT DOCUMENTS

JP 10-200486 7/1998
JP 11-38372 2/1999

* cited by examiner

Primary Examiner—Georgia Epps
Assistant Examiner—Tim Thompson
(74) Attorney, Agent, or Firm—McDermott, Will & Emery

(57) ABSTRACT

There is described an opto-electric conversion semiconductor device having a superior opto-electric conversion characteristic over a wide frequency range for optical communication. An opto-electric conversion element and one end of a high-frequency electric signal circuit are provided in proximity to each other. A location on the one end closest to the opto-electric conversion element is taken as a point of connection, and is connected to an electric signal terminal of the opto-electric conversion element by way of a conductor. A resistive matching circuit whose one end is grounded is connected to the electric signal terminal of the opto-electric conversion element. The point of connection provided on the one end of the high-frequency electric signal circuit is connected to a capacitive matching circuit whose impedance is determined such that the impedance at the point of connection to the direction of the opto-electric conversion element becomes same with the normalized impedance of the resistive matching circuit.

18 Claims, 25 Drawing Sheets

(a) with capacitive matching circuit
(b) without capacitive matching circuit

OPTO-ELECTRIC CONVERSION SEMICONDUCTOR DEVICE

BACKGROUND OF THE INVENTION

1. Field of the Invention

The present invention relates to an opto-electric conversion semiconductor device, and more particularly to, an opto-electric conversion semiconductor device having a superior opto-electric conversion characteristic over a wide frequency range for optical communication.

2. Background Art

An improvement in the performance of an opto-electric conversion semiconductor device for interconnecting a terminal electric line and an optical-fiber network plays an important role in attaining prevalence of a public communication network using optical fibers.

High-speed modulation for responding to an increase in the volume of transmitted information is indispensable for improving the performance of a semiconductor laser device or a photodiode that serves as an opto-electric conversion device. Further, an important requirement is that the semiconductor device or the photodiode has a good opto-electric conversion characteristic over a wide frequency range.

In order to effect high-speed modulation of a semiconductor laser device, an external modulation method is employed. According to this method, in order to enable long-distance transmission of a signal while reducing variations in the wavelength of the signal, which would occur during modulation, a signal is modulated by being passed through an optical modulator which is capable of controlling the amount of light passing therethrough through on-off operation in accordance with an optical signal, by means of causing a semiconductor laser to oscillate at a given intensity.

Control of the amount of light passing through the optical modulator through on-off operation, which is employed for the external modulation method, is achieved by means of the Franz-Keldysh effect, which arises when a reverse electric field is applied to an absorbing layer of an optical modulator, or by means of the quantum confinement Stark effect.

In the optical modulator, the absorption of a laser beam is changed according to a voltage to be applied to the optical modulator. Hence, a modulated signal voltage is applied to a high-frequency electric circuit connected to the optical modulator, and the laser beam to be output from an exit-end face of the optical modulator is subjected to intensity modulation in accordance with the signal voltage.

In a case where such an optical modulator is connected to a high-frequency electric circuit for enabling propagation of a modulated signal voltage, impedance matching must be ensured over the frequency range from d.c. to a modulation frequency, because the modulated signal voltage usually assumes a rectangular waveform. To this end, the amount of reflection attenuation, which would arise at a modulation frequency, must be increased, and the optical modulator must have a cut-off frequency sufficiently exceeding the modulation frequency.

The external modulation method encounters difficulty in establishing optical coupling between an optical modulator and a semiconductor laser and requires a large number of components, which adds to cost. In order to eliminate such a difficulty, there has been developed an optical modulator integrated semiconductor laser device which is formed by monolithic integration of a semiconductor laser and an optical modulator.

As in the case where the optical modulator is connected to a high-frequency electric circuit, the optical modulator integrated semiconductor laser device requires impedance matching over a wide frequency range from d.c. to a modulation frequency.

The foregoing description applies to a device for converting an electric signal into an optical signal. However, a photodiode for converting an optical signal into an electric signal also requires impedance matching over a wide frequency range from d.c. to a modulation frequency.

FIG. 25 is a plan view showing a commonly-known optical modulator described in, for example, Japanese Patent Laid-Open No. 38373/1999.

In FIG. 25, reference numeral 200 designates an optical modulator; 202 designates an optical modulation element; 204 designates a high-frequency electric circuit; 206 designates a high-frequency substrate; 208 designates a transmission line; 210 designates a matching circuit; 212 designates an open stub; and 214 designates a metal wire.

Arrow 216 designates incident light which corresponds to continuous light and originates from a laser; arrow 218 designates signal light modulated by the optical modulation element; and arrow 220 designates an electric signal which is applied to the optical modulation element 202 in the form of variations in a voltage by way of the high-frequency electric circuit 204.

The optical modulator 200 comprises the high-frequency electric circuit 204 having the matching circuit 210 formed from the open stub 212; the optical modulation element 202 provided at the tip end of the high-frequency electric circuit 204; and the metal wire 214 for connecting the optical modulation element 202 with the high-frequency electric circuit 204.

The commonly-known optical modulator 200 having the foregoing configuration operates as follows:

Upon efficient receipt of the incident light 216 by way of a coupling optical system (not shown), the optical modulation element 202 modulates the intensity of the incident light 216 in accordance with a variation in the voltage of the electric signal 220 by way of the Matching circuit 210 of the high-frequency electric circuit 210 and the metal wire 214, thereby emitting the signal light 218.

In this case, before entering the metal wire 214, the electric signal 220 is subjected to impedance matching performed by the matching circuit 210 formed from the open stub 212.

The open stub 212 corresponds to a capacitive matching circuit, and impedance matching is effected by means of only the matching circuit 210 formed from the open stub 212, and hence impedance matching can be achieved in the vicinity of only a certain frequency. Accordingly, the open stub 212 can improve the modulation characteristic of the optical modulator 200 within a narrow range but encounters difficulty in improving the modulation characteristic of the optical modulator 200 over a wide range.

Impedance matching is commonly achieved by use of only a terminating resistor. Use of only a terminating resistor may lead to matching for d.c. However, because of a parasitic capacitance of the optical modulation element 202 or the inductance of the metal wire used for electrical connection, an impedance mismatch arises in, particularly, a high frequency range, thereby rendering difficult attainment of a match over a wide frequency range.

The present invention has been conceived to solve the above-described drawbacks and is aimed at providing an opto-electric conversion semiconductor device which comprises a resistive matching circuit connected to a capacitive matching circuit by way of an opto-electric conversion semiconductor element and achieves impedance matching over a wide frequency range.

For reference, Japanese Patent Laid-Open No. 75003/1998 describes a semiconductor laser module for directly receiving a microwave frequency signal as a modulated signal, in which an impedance matching circuit unit utilizing capacitance is interposed between a laser diode chip and a signal input circuit.

Further, Japanese Patent Laid-Open No. 221509/1995 describes an invention which uses, as a terminating resistor formed from a chip resistor, a capacitive matching circuit for canceling the inductance component of a chip resistor.

SUMMARY OF THE INVENTION

According to one aspect of the present invention, an opto-electric conversion semiconductor device comprises a semiconductor element for opto-electric conversion of a signal which has an signal input electrode. A high-frequency electric signal circuit is provided which has one end positioned in proximity with the semiconductor element. The high-frequency electric signal circuit has a connection point in the one end at a location closest to the signal input electrode of the semiconductor element, and the connection point is connected to the signal input electrode of the semiconductor element by way of a conductor. A resistive matching circuit is connected to the signal input electrode at one end and to ground at the other end. A capacitive matching circuit is connected to the connection point of the high-frequency electric signal circuit. The capacitive matching circuit has an adjusted impedance such that an impedance at the connection point towards the semiconductor element is same with a normalized impedance of the resistive matching circuit.

According to another aspect, an opto-electric conversion semiconductor device comprises a semiconductor element for opto-electric conversion of a signal which has a signal input electrode. A high-frequency electric signal circuit is provided which has one end positioned in proximity with the semiconductor element. A resistive matching circuit is connected to the electric signal terminal by way of a conductor at one end and to ground at the other end. A resistance matching correction circuit is connected between the signal input electrode and the one end of the high-frequency electric signal circuit by way of a conductor. A capacitive matching circuit is connected to the one end of the high-frequency electric signal circuit. The capacitive matching circuit, has an adjusted impedance such that an impedance at the one end towards the semiconductor element is same with a normalized impedance of the resistive matching circuit in the vicinity of a desired frequency range.

In another aspect, in the opto-electric conversion semiconductor device, the semiconductor element may comprise either of an optical modulator element, an integrated semiconductor laser element equipped with an optical modulator, a photo sensitive element, and a flip-chip type semiconductor element.

Other features and advantages of the invention will be apparent from the following description taken in connection with the accompanying drawings.

DETAILED DESCRIPTION OF THE PREFERRED EMBODIMENTS

Figure 1:
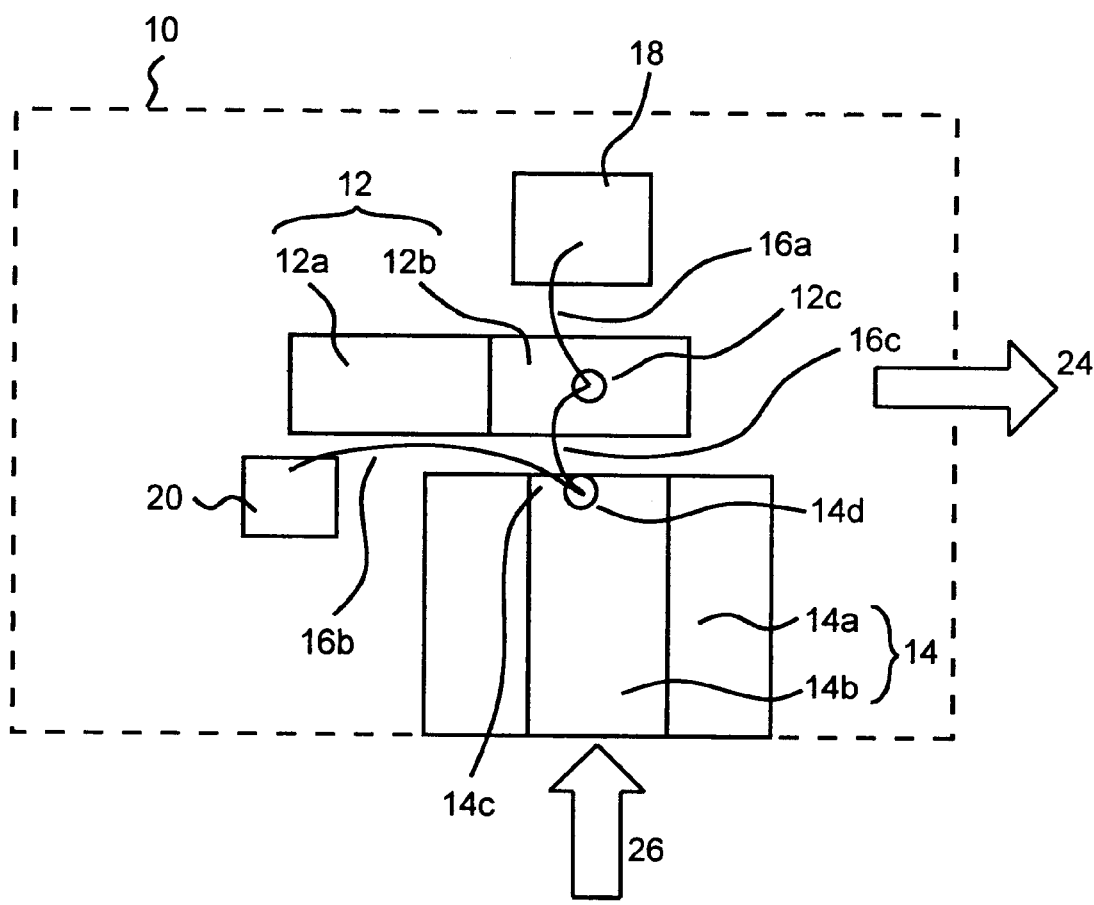
FIG. 1 is a plan view showing a semiconductor laser device equipped with an optical modulator according to a first embodiment of the present invention.

Preferred embodiments of the present invention will be described in detail with reference to the accompanying drawings. Throughout the drawings, the same reference numerals indicate the same or corresponding portions, and duplicated description may be avoided.

First Embodiment

FIG. 1 is a plan view showing a semiconductor laser device equipped with an optical modulator according to a first embodiment of the present invention.

As an example, a semiconductor laser device equipped with an electric field absorption type external optical modulator of 10 Gb/s used for trunk line communication, which are integrated on a same semiconductor substrate, will now be described by way of example.

In the present embodiment, a terminating resistor is arranged opposite a high-frequency electric circuit by way of an optical modulation section of a semiconductor laser element equipped with an optical modulator. One end of the high-frequency electric circuit is brought into close proximity with the optical modulator, and a metal wire connected to an electric signal terminal of the optical modulator of the semiconductor laser is connected to the leading edge of the end of the high-frequency electric circuit. Further, another metal wire connected to a capacitive matching circuit is connected to the end of the high-frequency electric circuit.

In FIG. 1, reference numeral 10 designates a semiconductor laser integrated with an optical modulator (generally, an opto-electric conversion semiconductor device, hereinafter referred to simply as a semiconductor laser device); 12 designates a laser element equipped with an optical modulator (generally, semiconductor element, hereinafter referred to simply as a laser element); 12a designates a semiconductor laser section; and 12b designates an optical modulator section. A signal input electrode 12c to which a modulated signal voltage is to be applied is provided on the optical modulator section 12b.

Reference numeral 14 designates a high-frequency electric signal circuit (hereinafter referred to a high-frequency electric circuit); 14a designates a high-frequency circuit substrate; and 14b designates a transmission line. One end 14c of the high-frequency electric circuit 14 is provided as close as possible to the signal input electrode 12c of the laser element 12. Reference numeral 16 designates a metal wire serving as a conductor, and the metal wire 16 comprises lines 16a, 16b, and 16c.

Reference numeral 18 designates a terminating resistor generally, a resistive matching circuit) whose one end is grounded and whose other end is wire-bonded to the signal input electrode 12c by way of the metal wire 16a.

Reference numeral 20 designates a capacitive matching circuit. The capacitive matching circuit 20 is shunt-connected to a matching circuit connection point 14d which is located at a position on the one end 14c of the high-frequency electric circuit 14 most close to the signal input electrode 12c, by means of the metal wire 16b and through wire bonding.

Similarly, the high-frequency electric circuit 14 is connected to the signal input electrode 12c through use of the metal wire 16c and by way of wire bonding. The point on the high-frequency electric circuit 14 to which the metal wire 16c is connected corresponds to the matching circuit connection point 14d.

Reference numeral 24 designates modulated signal light, and 26 designates a electric modulation signal to be applied to the optical modulator section 12b.

The capacitance of the capacitive matching circuit 20 must be optimized such that the impedance of the matching circuit connection point 14d with respect to the laser element 12 approaches a normalized impedance; that is, the resistance value of the terminating resistance 18, over a wide frequency rage.

In order to determine the capacitance of the capacitive matching circuit 20, the frequency characteristic of the semiconductor laser device 10 having the foregoing configuration is computed through simulation. The capacitance of the capacitive matching circuit 20 is determined such that the cut-off frequency of the capacitive matching circuit 20 is maximized while the impedance of the optical modulator section 12b of the laser element 12 with respect to the terminating resistor 18 approaches the normalized impedance; that is, 50 Ω in this case. After assembly of the semiconductor laser device 10, the capacitance of the capacitive matching circuit 20 is finely adjusted while the frequency response characteristic of the semiconductor laser device 10 is measured.

At this time, the matching circuit connection point 14d must be made as close as possible to the optical modulator section 12b. In other words, the matching circuit connection point 14d is made close to the signal input electrode 12c, to thereby shorten a conductor for interconnecting therebetween; for example, the metal wire 16c, and to reduce the inductance of the conductor. As a result, the cut-off frequency of the capacitive matching circuit 20 can be significantly increased.

The operation of the semiconductor laser device 10 will now be described.

A d.c. current is made to flow to the semiconductor laser section 12a of the laser element 12, so that continuous light of a certain intensity is emitted from the semiconductor laser section 12a. At this time, when a electric modulation signal 26 is sent to the high-frequency electric circuit 14 from an external signal circuit (not shown), voltage variations serving as the electric modulation signal 26 are applied to the signal input electrode 12c by way of the matching circuit connection point 14d, which corresponds to a location on the one end 14c of the high-frequency electric circuit 14 close to the signal input electrode 12c, and by way of the metal wire 16c.

Since the absorption of the laser beam changes in accordance with the voltage applied to the optical modulator section 12b, intensity variations corresponding to the electric modulation signal 26 appear in the laser beam emitted from the exit end face of the optical modulator section 12b, and is emitted as the modulated signal light 24.

The semiconductor laser device 10 effects impedance matching of a d.c. current or impedance matching of comparatively low frequency through use of the terminating resistor 18. Further, the capacitive matching circuit 20 shunt-connected to the matching circuit connection point 14d cancels the parasitic capacitance of the optical modulator section 12b, the inductance component of the metal wire 16c interconnecting the high-frequency electric circuit 14 and the laser element 12, and the inductance component of the metal wire 16a interconnecting the laser element 12 and the terminating resistor 18, thus attaining impedance matching at a high frequency. The cut-off frequency of the capacitive matching circuit 20 can be set to as high a frequency as possible.

Accordingly, the semiconductor laser device 10 has a superior modulation characteristic over a wide frequency range from d.c. to a modulation frequency.

Figure 2:
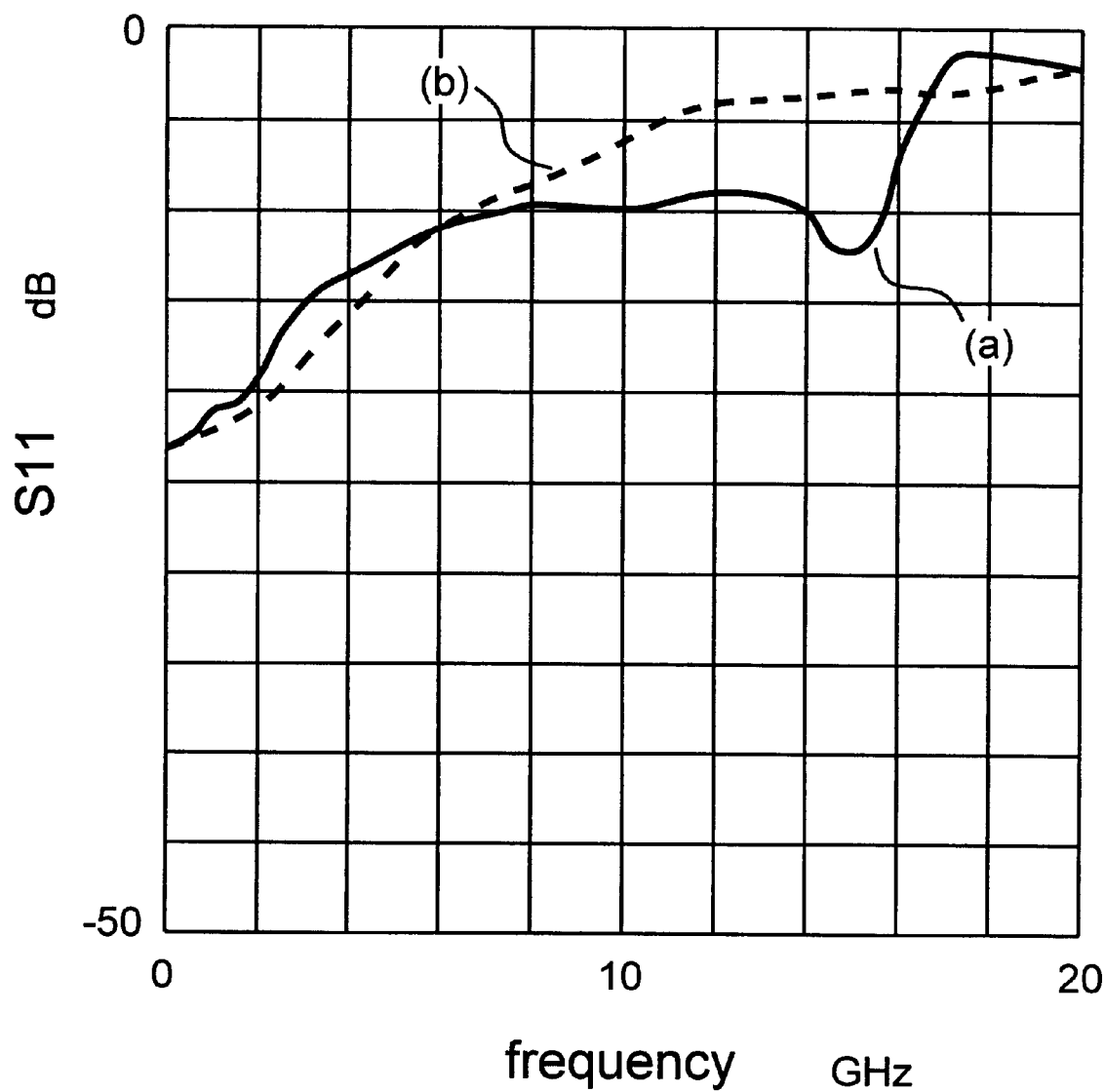
FIG. 2 is a graph showing the RF return loss characteristic of the input side of the semiconductor laser device according to the first embodiment.
Figure 3:
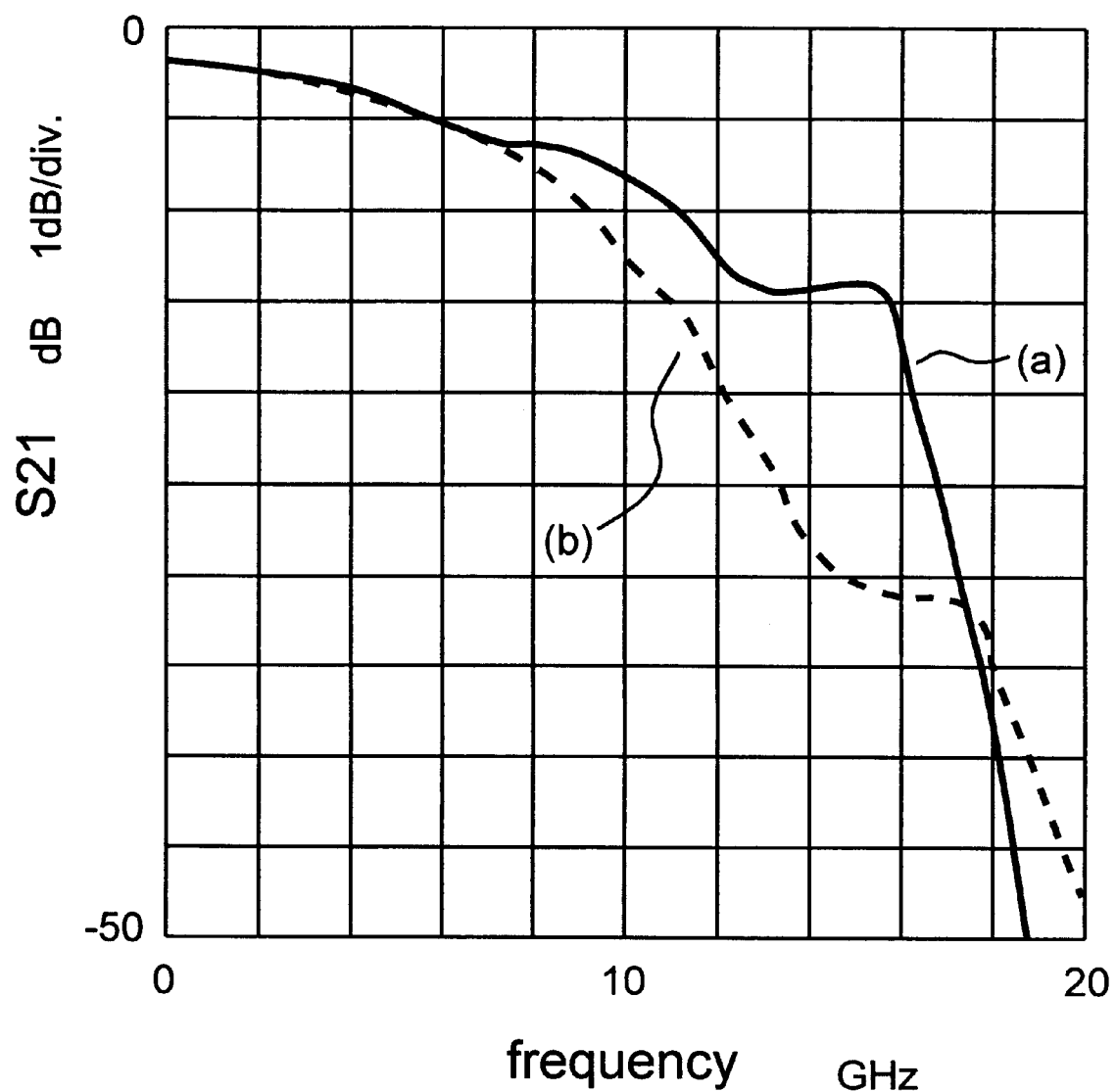
FIG. 3 is a graph showing the frequency response characteristic of the semiconductor laser device according to the first embodiment.

FIG. 2 is a graph showing the RF return loss characteristic of the input side of the semiconductor laser device 10 according to the first embodiment. FIG. 3 is a graph showing the frequency response characteristic of the semiconductor laser device 10 according to the first embodiment.

In FIG. 2, the horizontal axis represents frequency, and the vertical axis represents S-parameter S11. In FIG. 3, the horizontal axis represents frequency, and the vertical axis represents S-parameter S21. FIGS. 2 and 3 show example improvements in the modulation characteristic of the semiconductor laser device 10. For comparison with a commonly-known laser device equipped with an optical modulator, the modulation characteristic of the semiconductor laser device 10 of the present embodiment equipped with the terminating resistor 18 and the capacitive matching circuit 20 is designated by a solid line (a), and the modulation characteristic of the commonly-known laser device having only the terminating resistor 18 and not having the capacitive matching circuit 20 is designated by a broken line (b).

In the present embodiment, the capacitive matching circuit 20 of about 0.12 pF located in proximity to the optical modulator section 12b of the laser element 12 is connected to the matching circuit connection point 14d. As a result, the reflection attenuation caused at a 10 GHz is improved from 6.6 dB to 10.0 dB, as shown in FIG. 2, and the cut-off frequency of the capacitive matching circuit 20 is improved from 11.5 GHz to 16.0 GHz, as shown in FIG. 3.

As mentioned above, in the first embodiment, there can be assembled an optical-modulator-equipped laser device which achieves a large reflection attenuation and high cut-off frequency over a wide frequency range from d.c. to a modulation frequency and has a superior modulation characteristic.

Second Embodiment

Figure 4:
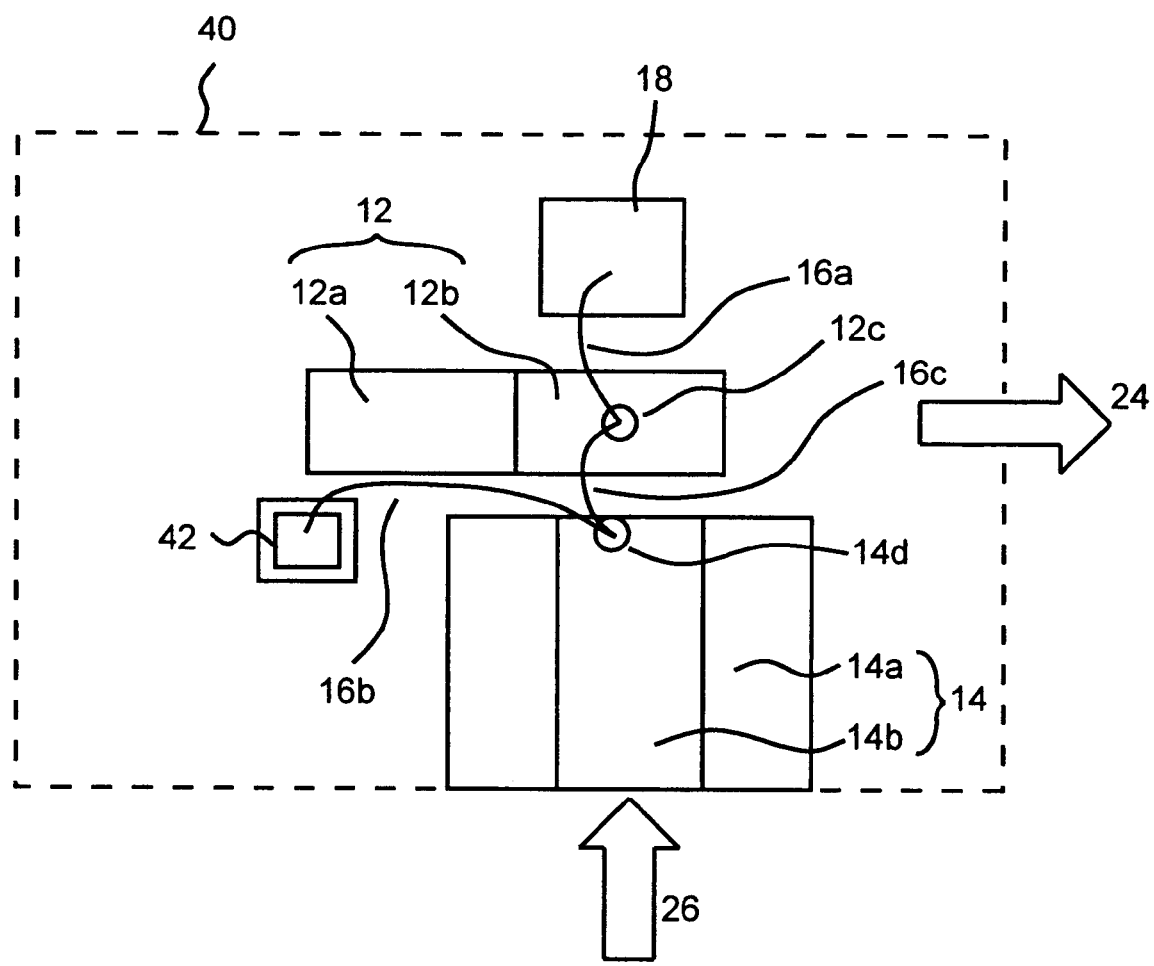
FIG. 4 is a plan view showing a semiconductor laser device equipped with an optical modulator according to a second embodiment of the present invention.

FIG. 4 is a plan view showing a semiconductor laser device equipped with an optical modulator according to a second embodiment of the present invention.

The semiconductor laser device of the present embodiment corresponds to the semiconductor laser device of the first embodiment whose capacitive matching circuit 20 is made up of a chip capacitor 42.

In FIG. 4, reference numeral 40 designates a semiconductor laser device equipped with an optical modulator, and 42 designates a chip capacitor. In FIG. 4, those reference numerals which are the same as those employed in connection with the first embodiment designate the same or corresponding elements.

The chip capacitor 42 is generally compact and superior in terms of ease of packaging. In the second embodiment, a laser device equipped with an optical modulator having a superior frequency characteristic can be made compact and inexpensive.

Third Embodiment

Figure 5:
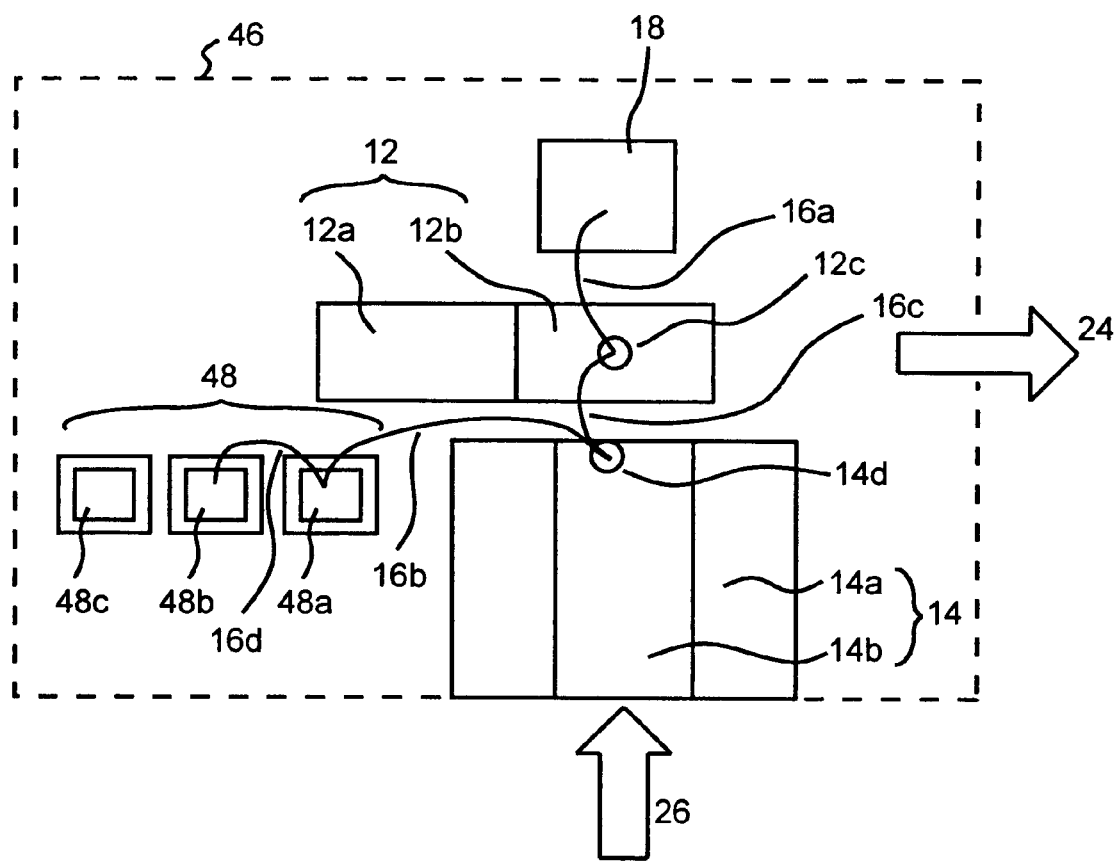
FIG. 5 is a plan view showing a semiconductor laser device equipped with an optical modulator according to a third embodiment of the present invention.

FIG. 5 is a plan view showing a semiconductor laser device equipped with an optical modulator according to a third embodiment of the present invention.

The semiconductor laser device of the present embodiment corresponds to the semiconductor laser device of the first embodiment whose capacitive matching circuit 20 is made up of a plurality of chip capacitors 48.

In FIG. 5, reference numeral 46 designates a semiconductor laser device equipped with an optical modulator; 48 designates a chip capacitor; and 16d designates a metal wire for interconnecting the chip capacitors 48. In FIG. 5, those reference numerals which are the same as those employed in connection with the first embodiment designate the same or corresponding elements.

The plurality of chip capacitors 48 according to the third embodiment; i.e., chip capacitors 48a, 48b, and 48c, can be interconnected by means of the metal wire 16d. A required number of chip capacitors 48 are interconnected through use of the metal wire 16d, in accordance with variation in the parasitic capacitance of the optical modulator section 12b of the semiconductor laser element 12; variation in the inductance of the metal wire 16c connecting the high-frequency electric circuit 14 with the semiconductor laser element 12, which variation is due to variation in the length of the metal wire 16c; or variation in the inductance of the metal wire 16a connecting the terminating resistor 18 with the semiconductor laser element 12, which variation is due to variation in the length of the metal wire 16a, thereby enabling fine control of the capacitance required for impedance matching. The modulation characteristic of the semiconductor laser device 46 can be individually optimized one by one, thereby enabling an increase in the yield of a semiconductor laser device having an optical modulator.

In a modification of the third embodiment, a plurality of chip capacitors 48 are interconnected beforehand through use of the metal wire 16d. The total capacitance of the chip capacitors 48a to 48c may be finely controlled by means of disconnecting the metal wire 16d interconnecting unneeded chip capacitors, in accordance with variations in the parasitic capacitance of the optical modulator section 12b of the semiconductor laser element 12; variation in the inductance of the metal wire 16c connecting the high-frequency electric circuit 14 with the semiconductor laser element 12, which variation is due to variation in the length of the metal wire 16c; or variation in the inductance of the metal wire 16a connecting the terminating resistor 18 with the semiconductor laser element 12, which variation is due to variation in the length of the metal wire 16a. The total capacitance of the chip capacitors 48a to 48c can be readily controlled.

Fourth Embodiment

Figure 6:
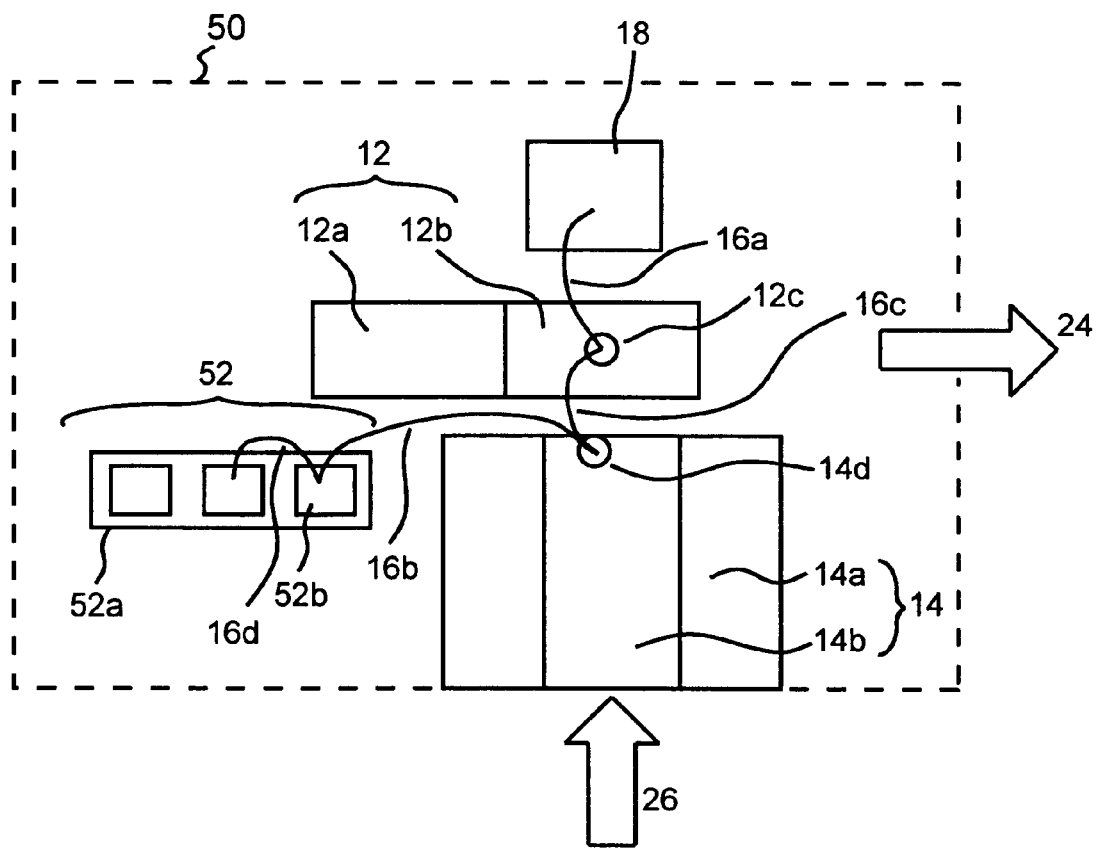
FIG. 6 is a plan view showing a semiconductor laser device equipped with an optical modulator according to a fourth embodiment of the present invention.

FIG. 6 is a plan view showing a semiconductor laser device equipped with an optical modulator according to a fourth embodiment of the present invention.

The semiconductor laser device of the present embodiment corresponds to the semiconductor laser device of the first embodiment whose capacitive matching circuit 20 is made up of a chip capacitor 52 comprising a plurality of counter electrodes placed on top of a single common electrode.

In FIG. 6, reference numeral 50 designates a semiconductor laser device equipped with an optical modulator; 52 designates a chip capacitor; 52a designates a common electrode of the chip capacitor 52; and 52b designates counter electrodes. In FIG. 6, those reference numerals which are the same as those employed in connection with the first embodiment designate the same or corresponding elements.

The chip capacitor 52 according to the fourth embodiment is formed by combination of a single common electrode 52a and a plurality of counter electrodes 52b mounted thereon. Thus, the thus-embodied chip capacitor is superior in terms of ease of mounting, and the capacitance of the capacitors can be finely adjusted by selection of the chip capacitor, as required. Therefore, the semiconductor laser device 50 equipped with the optical modulator can be embodied compact and inexpensive.

Fifth Embodiment

Figure 7:
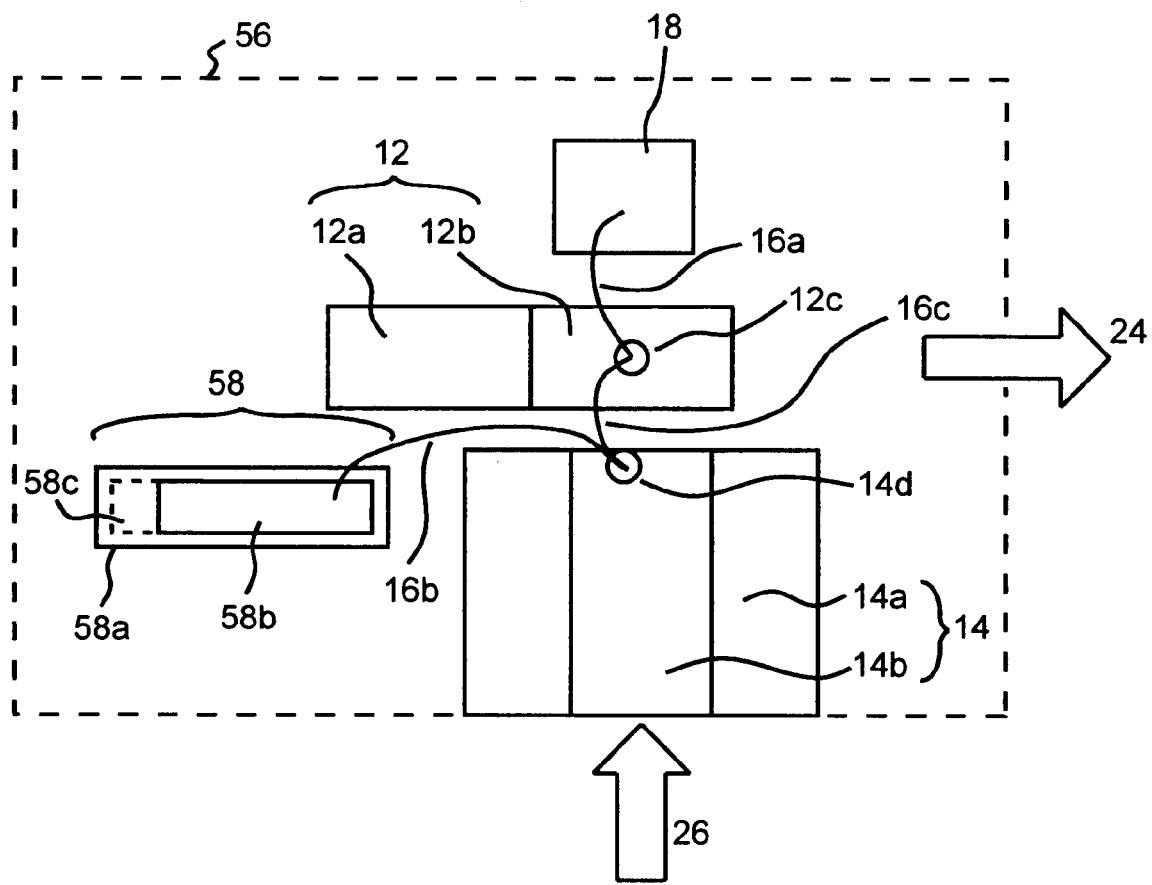
FIG. 7 is a plan view showing a semiconductor laser device equipped with an optical modulator according to a fifth embodiment of the present invention.

FIG. 7 is a plan view showing a semiconductor laser device equipped with an optical modulator according to a fifth embodiment of the present invention.

The semiconductor laser device of the present embodiment corresponds to the semiconductor laser device of the first embodiment whose capacitive matching circuit 20 is formed from a trimmer chip capacitor 58.

In FIG. 7, reference numeral 56 designates a semiconductor laser device equipped with an optical modulator; 58 designates a chip capacitor; 58a designates a common electrode of the chip capacitor 58; 58b designates a counter electrode plate; and 58c designates a trimmed portion of the counter electrode plate 58b. In FIG. 7, those reference numerals which are the same as those employed in connection with the first embodiment designate the same or corresponding elements.

The chip capacitor for impedance matching correction purpose according to the fifth embodiment is formed from the trimmer chip capacitor 58. Initially, the chip capacitor 58 is formed so as to have capacitance slightly greater than the capacitance satisfying the expected and required capacitance. The chip capacitor 58 is trimmed, as required, so as to assume a required capacitance, in accordance with variation in the parasitic capacitance of the optical modulator section 12b of the semiconductor laser element 12; variation in the inductance of the metal wire 16c connecting the high-frequency electric circuit 14 with the semiconductor laser element 12, which variation is due to variation in the length of the metal wire 16c; or variation in the inductance of the metal wire 16a connecting the terminating resistor 18 with the semiconductor laser element 12, which variation is due to variation in the length of the metal wire 16a. As a result, the capacitance of the chip capacitor 58 can be finely and appropriately adjusted, and the modulation characteristic of the semiconductor laser device 56 can be minutely optimized, thereby increasing the yield of a semiconductor laser devices equipped with an optical modulator.

Sixth Embodiment

Figure 8:
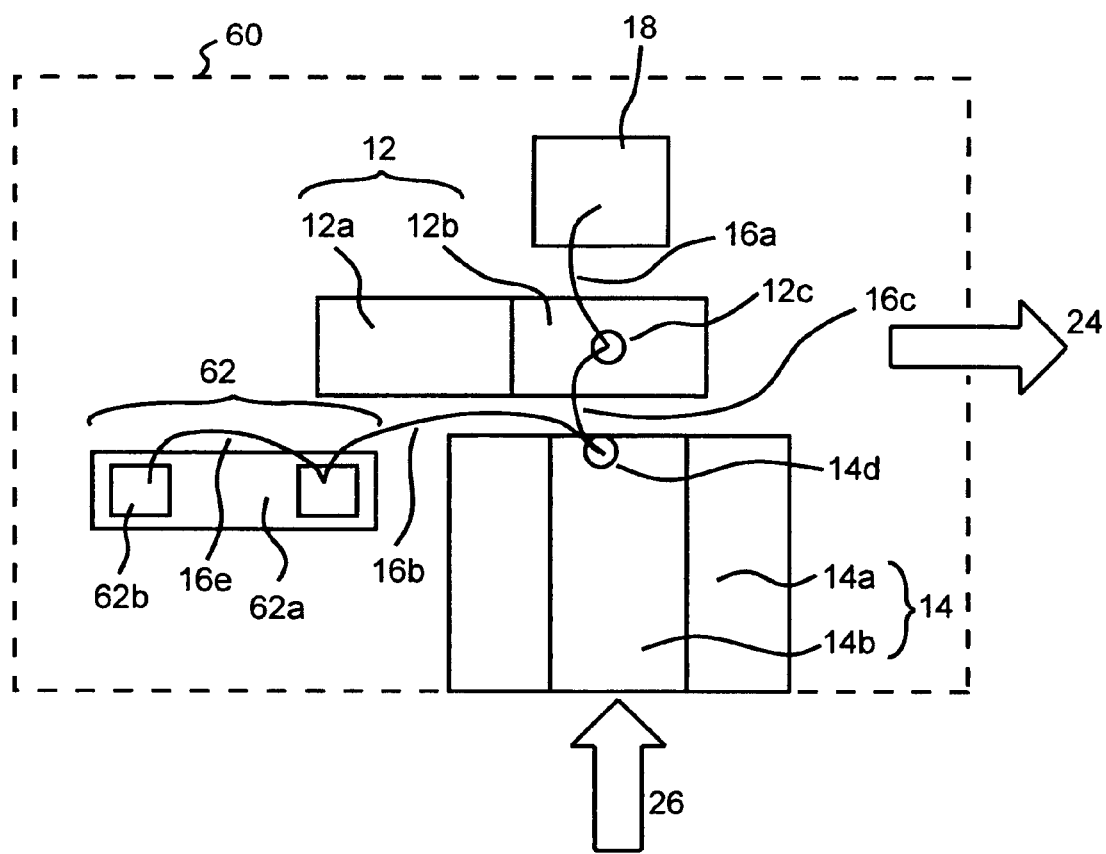
FIG. 8 is a plan view showing a semiconductor laser device equipped with an optical modulator according to a sixth embodiment of the present invention.

FIG. 8 is a plan view showing a semiconductor laser device equipped with an optical modulator according to a sixth embodiment of the present invention.

A semiconductor laser device 60 equipped with an optical modulator according to the present embodiment employs a chip capacitor 62 as the capacitive matching circuit 20 according to the first embodiment.

In FIG. 8, reference numeral 60 designates a semiconductor laser device equipped with an optical modulator; 62 designates a chip capacitor; 62a designates a common electrode of the chip capacitor 62; 62b designates a plurality of counter electrodes; and 16e designates a metal wire. In FIG. 8, those reference numerals which are the same as those employed in connection with the first embodiment designate the same or corresponding elements.

The chip capacitor 62 according to the sixth embodiment is formed from the common electrode 62a having the plurality of counter electrodes 62b mounted thereon, and the metal wire 16e interconnecting the counter electrodes 62b. The total capacitance of the chip capacitor 62 is finely adjusted by control of length of the metal wire 16e.

As mentioned above, the plurality of counter electrodes 62b are mounted on the common electrode 62a of the chip capacitor 62, and the counter electrodes 62b are interconnected by way of the metal wire 16e. The metal wire 16e interconnecting the individual counter electrodes 62b serves as capacitive impedance, and the total capacitance changes in accordance with the length of the metal wire 16e. There is formed a capacitive matching circuit whose capacitance is substantially satisfied by the capacitance of the common electrode 62a and the counter electrodes 62b. The total capacitance of the chip capacitor 62 is finely adjusted by control of length of the metal wire 16e, in accordance with variations in the parasitic capacitance of the optical modulator section 12b of the semiconductor laser element 12; variation in the inductance of the metal wire 16c connecting the high-frequency electric circuit 14 with the semiconductor laser element 12, which variation is due to variation in the length of the metal wire 16c; or variation in the inductance of the metal wire 16a connecting the terminating resistor 18 with the semiconductor laser element 12, which variation is due to variation in the length of the metal wire 16a. The modulation characteristic of the respective semiconductor laser device 60 equipped with an optical modulator can be optimized, thus increasing the yield of semiconductor laser devices equipped with optical modulators.

Seventh Embodiment

Figure 9:
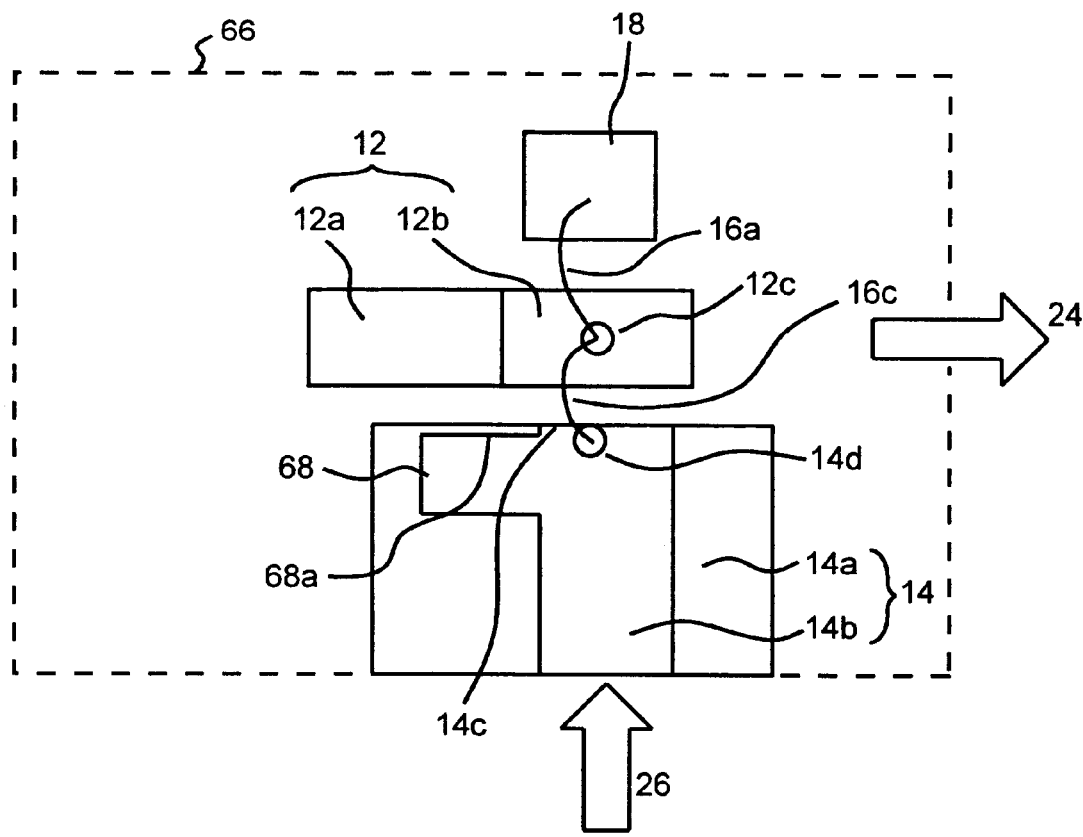
FIG. 9 is a plan view showing a semiconductor laser device equipped with an optical modulator according to a seventh embodiment of the present invention.

FIG. 9 is a plan view showing a semiconductor laser device equipped with an optical modulator according to a seventh embodiment of the present invention.

The semiconductor laser device of the present embodiment corresponds to the semiconductor laser device of the first embodiment whose capacitive matching circuit 20 is formed from an open stub 68 provided in the transmission line 14b of the high-frequency electric circuit 14.

In FIG. 9, reference numeral 66 designates a semiconductor laser device equipped with an optical modulator, and 68 designates an open stub. In FIG. 9, those reference numerals which are the same as those employed in connection with the first embodiment designate the same or corresponding elements.

The one end 14c of the high-frequency electric circuit 14 is provided as close as possible to the signal input electrode 12c of the laser element 12, and the open stub 68 is provided as close as possible to the one end 14c.

One side 68a of the open stub 68 is made as close as possible to the edge of the one end 14c of the high-frequency electric circuit 14. A metal wire 16c for interconnecting the high-frequency electric circuit 14 and the signal input electrode 12c is wire-bonded to a point located within the transmission line 14b and on the extension of the side 68a. The point of wire bonding acts as the matching circuit connection point 14d for the open stub 68.

In the semiconductor laser device 66 according to the seventh embodiment, the transmission line 14b of the high-frequency electric circuit 14 and the open stub 68 serving as a capacitive matching circuit can be formed integrally, thereby diminishing the number of components. Thus, a semiconductor laser device equipped with an optical modulator can be produced at low cost.

Alternatively, the open stub 68 may be provided as a primary capacitive matching circuit, and the capacitance of the capacitive matching circuit may be finely adjusted through use of the chip capacitors described in connection with the second, third, fourth, fifth, and sixth embodiments.

Alternatively, an adjustable capacitive matching circuit may be formed from an island circuit pattern laid on the high-frequency circuit substrate 14a. The capacitance of the open stub 68 may be finely adjusted by means of connecting the open stub 68 with the island circuit pattern.

Eighth Embodiment

Figure 10:
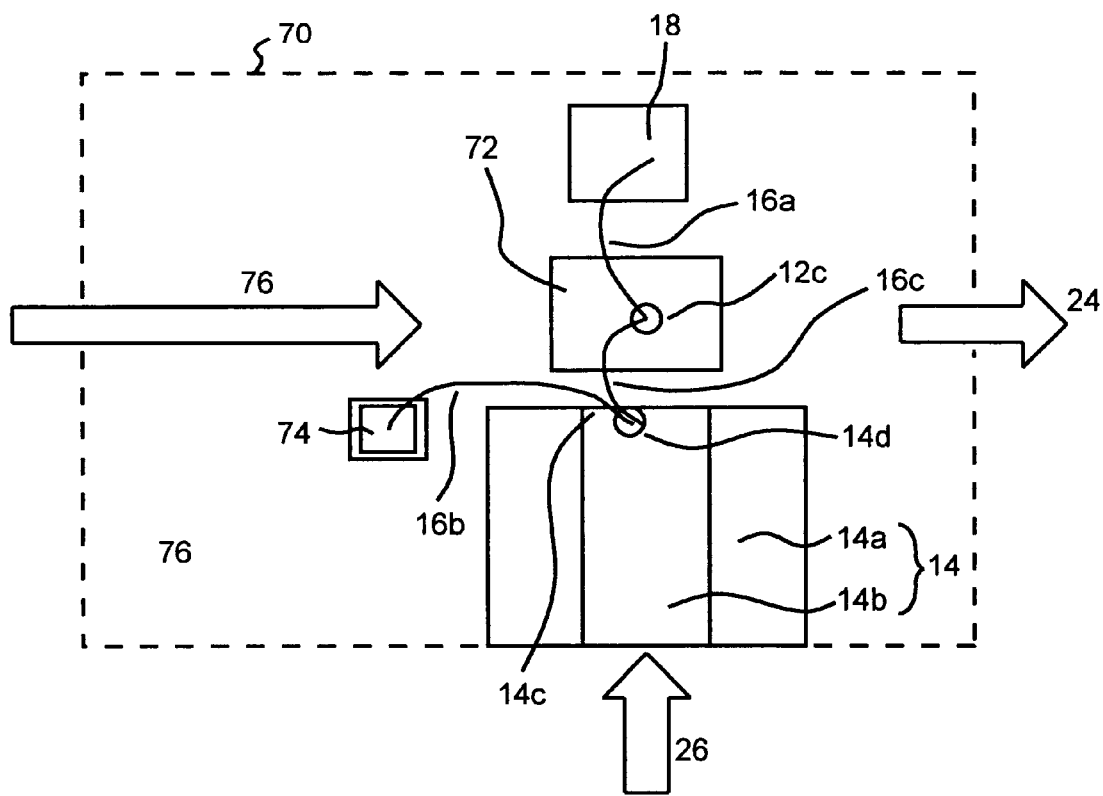
FIG. 10 is a plan view showing an optical modulator according to an eighth embodiment of the present invention.

FIG. 10 is a plan view showing an optical modulator according to an eighth embodiment of the present invention.

The present embodiment is intended to extend the frequency range of modulation characteristic of the optical modulator.

In FIG. 10, reference numeral 70 designates an optical modulator; 72 designates an optical modulator element; and 74 designates a capacitive matching circuit; for example, a chip capacitor. The chip capacitor may correspond to any one of the chip capacitors described in connection with the second, third, fourth, fifth, and sixth embodiments or the open stub described in connection with the seventh embodiment.

Reference numeral 76 designates continuous light emitted from a semiconductor laser (not shown) and input to the optical modulator element 72.

In FIG. 10, those reference numerals which are the same as those employed in connection with the first embodiment designate the same or corresponding elements.

The chip capacitor 74 is shunt-connected to the matching circuit connection point 14d, which is the location of the one end 14c of the high-frequency electric circuit 14 closest to the signal input electrode 12, by way of the metal wire 16b.

Continuous light 76 of given intensity emitted from a semiconductor laser (not shown) enters the optical modulator element 72 by way of an optical system (not shown). As in the case of the first embodiment, voltage variations are applied to the signal input electrode 12c as the electric modulation signal 26, and the continuous light 76 is subjected to intensity modulation corresponding to the electric modulation signal 26, wherewith the light is output from the optical modulator element 72 as the signal light 24.

As in the case of the first embodiment, the optical modulator 70 effects impedance matching at d.c. or a comparatively low frequency through use of the terminating resistor 18. The capacitive matching circuit 20 shunt-connected to the matching circuit connection point 14d cancels the parasitic capacitance of the optical modulator element 72, an inductance component of the metal wire 16c interconnecting the high-frequency electric circuit 14 and the optical modulator element 72, and an inductance component of the metal wire 16a interconnecting the high-frequency electric circuit 14 and the terminating resistor 18, thereby accomplishing high-frequency impedance matching. Consequently, the optical modulator 70 can be produced to have a superior modulation characteristic over a wide frequency range from d.c. to a modulation frequency.

Ninth Embodiment

Figure 11:
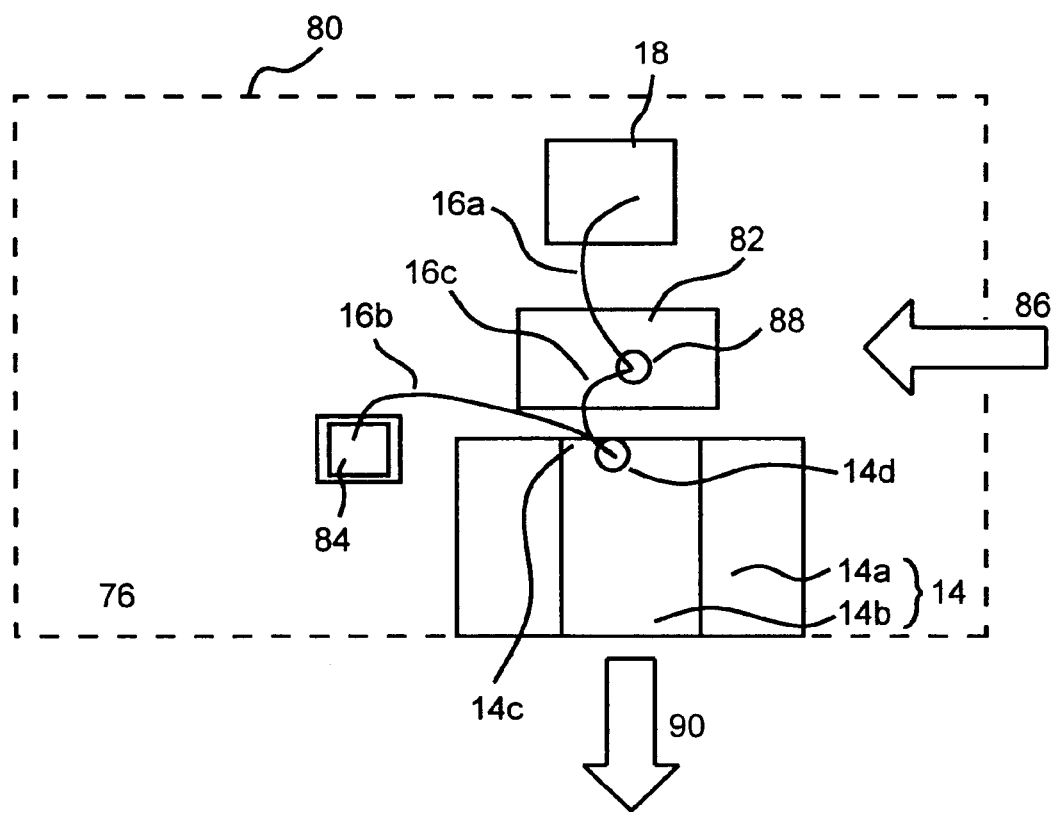
FIG. 11 is a plan view showing a photodiode device according to a ninth embodiment of the present invention.

FIG. 11 is a plan view showing a photodiode device according to a ninth embodiment of the present invention.

The present embodiment is intended to extend the frequency range of modulation characteristic of the photodiode device.

In FIG. 11, reference numeral 80 designates a photodiode device (generally, a photo-sensitive device); 82 designates a photo-diode element (generally, a photo-sensitive element); and 84 designates a capacitive matching circuit; for example, a chip capacitor. The chip capacitor may correspond to any one of the chip capacitors described in connection with the second, third, fourth, fifth, and sixth embodiments or the open stub described in connection with the seventh embodiment.

Reference numeral 86 designates signal light input to the photo-diode 82 by way of an optical system (not shown); 88 designates a signal output electrode of the photo-diode element 82; and 90 designates an electric signal transmitted to an external circuit (not shown) by way of the high-frequency electric circuit 14. In FIG. 11, those reference numerals which are the same as those employed in connection with the first embodiment designate the same or corresponding elements.

The chip capacitor 84 is shunt-connected to the matching circuit connection point 14d, which is the location of the end 14c of the high-frequency electric circuit 14 closest to the signal input electrode 12, by way of the metal wire 16b.

The signal light 86 input to the photo-diode 82 by way of an optical system (not shown) is converted into an electric signal 90 by means of the photo-diode element 82. The electric signal 90 is transmitted to the high-frequency electric circuit 14 from the signal output electrode 88 by way of the metal wire 16c and the matching circuit connection point 14d and is output to an external circuit (not shown).

The photo-diode device 80 effects impedance matching at d.c. or a comparatively low frequency through use of the terminating resistor 18. The capacitive matching circuit 20 shunt-connected to the matching circuit connection point 14d cancels the parasitic capacitance of the photo-diode 82, an inductance component of the metal wire 16c interconnecting the high-frequency electric circuit 14 and the photo-diode 82, and an inductance component of the metal wire 16a interconnecting the photo-diode 82 and the terminating resistor 18, thereby accomplishing high-frequency impedance matching. Consequently, there can be formed the photo-diode device 80 having a superior modulation characteristic over a wide frequency range from d.c. to a modulation frequency.

Tenth Embodiment

Figure 12:
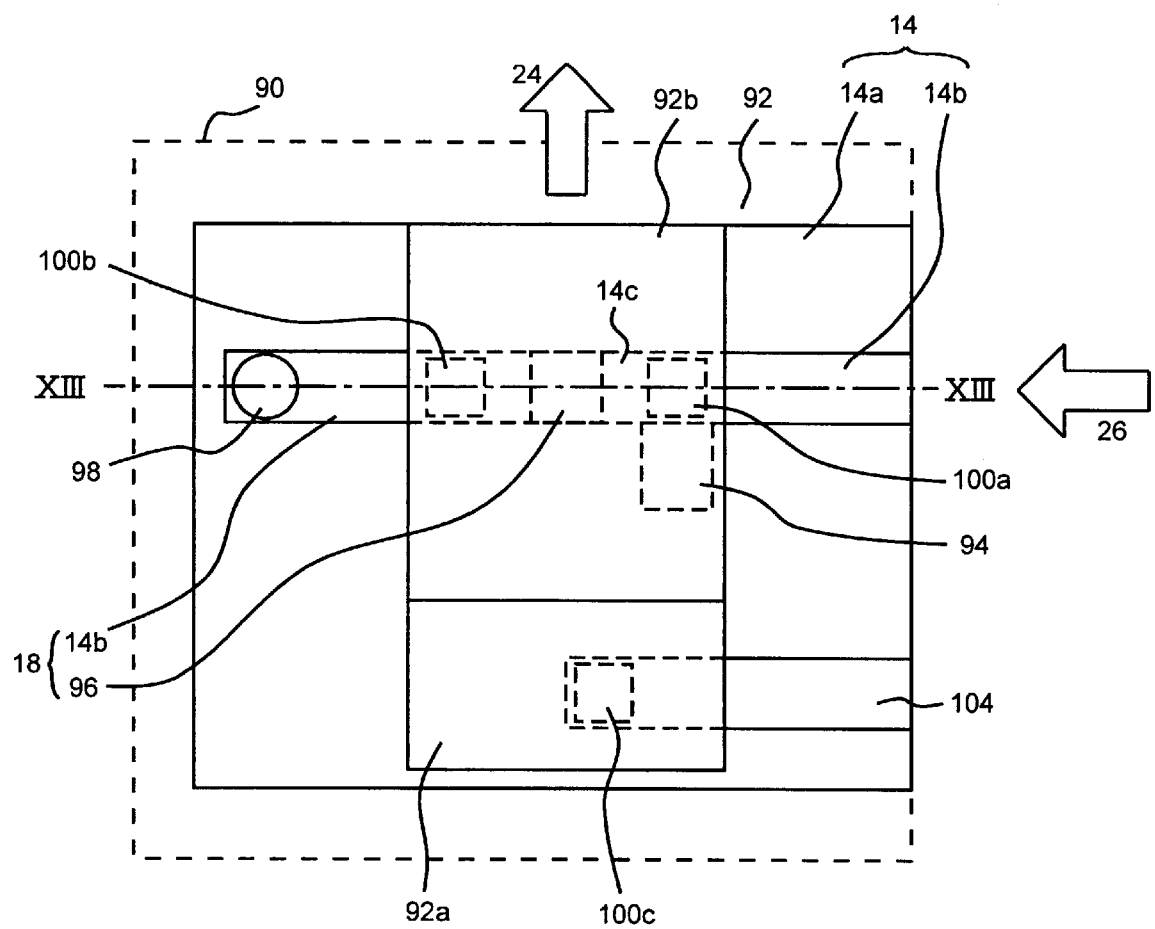
FIG. 12 is a plan view showing a semiconductor laser device equipped with an optical modulator according to a tenth embodiment of the present invention.
Figure 13:
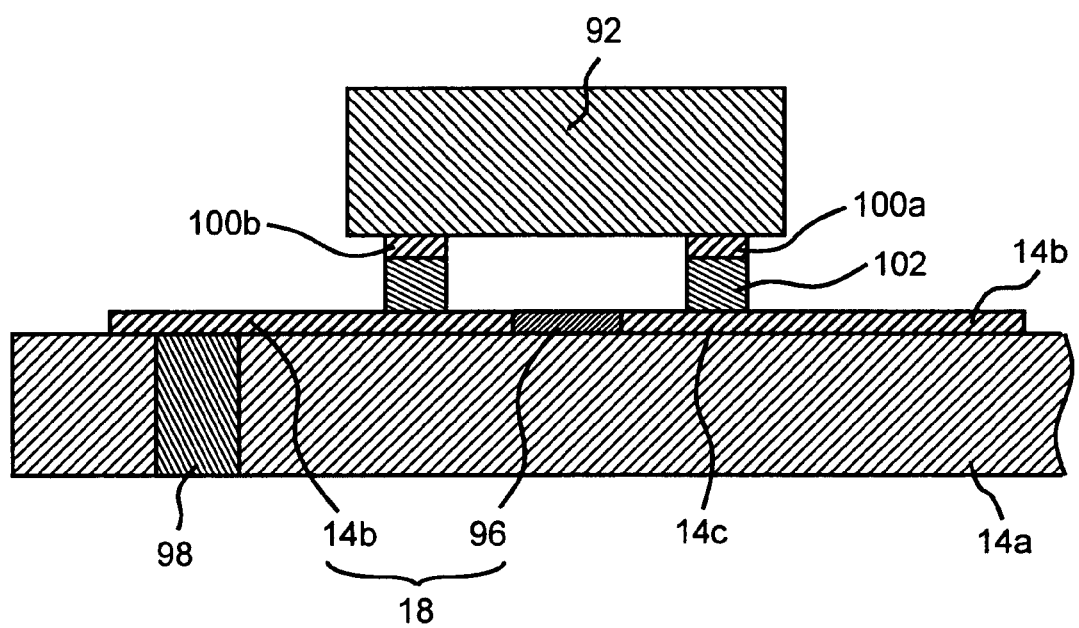
FIG. 13 is a cross-sectional view taken along line XIII—XIII shown in FIG. 12.

FIG. 12 is a plan view showing a semiconductor laser device equipped with an optical modulator according to a tenth embodiment of the present invention, and FIG. 13 is a cross-sectional view taken along line XIII—XIII shown in FIG. 12.

The present embodiment is intended to extend the frequency range of modulation characteristic of a flip-chip opto-electric conversion semiconductor device.

In FIG. 12, reference numeral 90 designates a semiconductor laser device equipped with a flip-chip optical modulator; 92 designates a semiconductor laser element equipped with a flip-chip optical modulator; 92a designates a semiconductor laser section; and 92b designates an optical modulator.

Reference numeral 94 designates an open stub; 96 designates a resistor of the terminating resistor 18; and 98 designates a through hole for grounding an end of the resistor 96 via the transmission line 14b. Reference numeral 100a designates a signal input electrode of the optical modulator 92b; and 100b designates a ground electrode of the semiconductor laser element 92 by way of which the semiconductor laser section 92a and the optical modulator 92b are grounded. Reference numeral 100c designates a laser input electrode for receiving a drive current to be applied to the semiconductor laser section 92a; and 104 designates a semiconductor laser wiring layer for application of drive current to the semiconductor laser section 92a.

In FIGS. 13 and 12, reference numeral 102 designates solder serving as a connection conductor. The transmission line 14b, the signal input electrode 100a, the ground electrode 100b, the laser wiring layer 104, and the laser input electrode 100c are interconnected by way of the solder 102. In FIGS. 12 and 13, those reference numerals which are the same as those employed in connection with the first embodiment designate the same or corresponding elements.

In FIGS. 12 and 13, the semiconductor laser device 90 is configured as follows: On the high-frequency circuit substrate 14a, there are connected the signal-input-side transmission line 14b, to which the electric modulation signal 26 is applied, and the grounded transmission line 14b, which is grounded by way of the through-hole 98, via a resistor 96. The signal input electrode 100a of the optical modulator 92b is connected to the signal-input-side transmission line 14b by means of the solder 102, and the ground electrode 100b is connected to the ground-side transmission line 14b by means of the solder 102.

The laser input electrode 100c of the semiconductor laser section 92a is connected to the laser wiring layer 104 by means of the solder 102 (not shown).

In the semiconductor laser device 90 equipped with an optical modulator, the signal input electrode 100a of the optical modulator 92b of the semiconductor element 92 is connected to the high-frequency electric circuit 14 by way of the solder 102 bonded to the transmission line 14b. In contrast with a case where the signal input electrode 100a is connected to the high-frequency electric circuit 14 by way of the metal wire 16, the signal input electrode 100a is provided closer to the one end 14c of the transmission line 14b, as well as to the open stub 94, wherewith the total inductance of the connection conductors is made smaller. Further, in contrast with a case where the signal input electrode 100a is connected to the high-frequency electric circuit 14 by way of the metal wire 16, the parasitic capacitance of the optical modulator 92b becomes more stable, and hence variation in the capacitance of the semiconductor laser device 90 to be controlled by the signal input electrode 100a and the open stub 94 is reduced. Consequently, there can be formed a high-yield semiconductor laser device 90 with an optical modulator having a superior modulation characteristic over a wide frequency band.

Eleventh Embodiment

Figure 14:
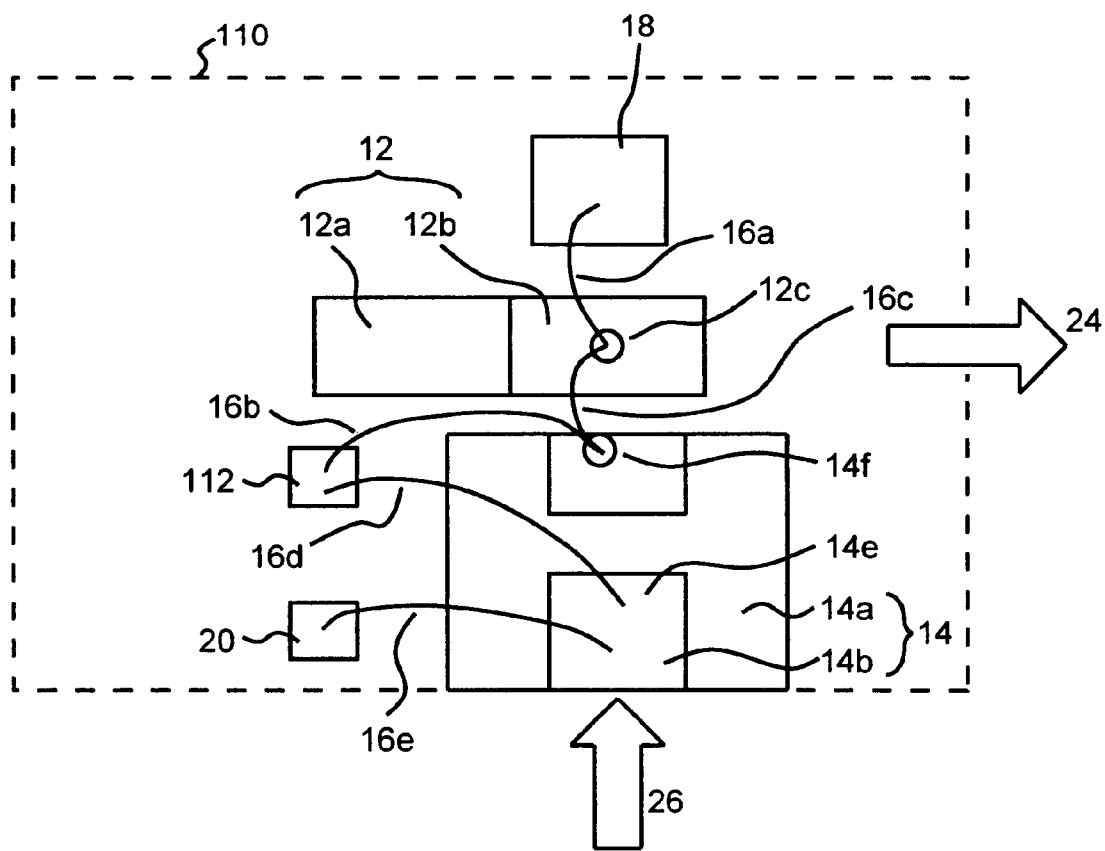
FIG. 14 is a plan view showing a semiconductor laser device equipped with an optical modulator according to an eleventh embodiment of the present invention.

FIG. 14 is a plan view showing a semiconductor laser device equipped with an optical modulator according to an eleventh embodiment of the present invention.

The present embodiment is intended to improve the modulation characteristic of the semiconductor laser device equipped with an optical modulator not through use of only the capacitive matching circuit, but to prevent deterioration of waveform of modulation light while a reflection attenuation is made greater by insertion of a resistance matching correction circuit in series between the one end of the high-frequency electric circuit and the semiconductor laser device equipped with an optical modulator, to thereby attain a superior modulation characteristic.

In FIG. 14, reference numeral 110 designates a semiconductor laser device equipped with an optical modulator; 12 designates a laser element equipped with an optical modulator; 12a designates a semiconductor laser section; 12b designates an optical modulator section; and 12c designates a signal input electrode for applying a modulation signal voltage to the optical modulator section 12b.

Reference numeral 14 designates a high-frequency electric circuit; 14a designates a high-frequency circuit substrate; and 14b designates a transmission line. One end 14e of the transmission line 14b is connected to the signal input electrode 12c of the optical modulator section 12b by way of the serially-connected resistance matching correction circuit 112.

More specifically, one end of the resistance matching correction circuit 112 is connected to the one end 14e of the transmission line 14b by way of the metal wire 16d, and the other end of the resistance matching correction circuit 112 is connected to a point of connection 14f provided on the high-frequency substrate 14a by way of the metal wire 16b. Further, the point of connection 14f is connected to the signal input electrode 12c of the optical modulator section 12b by way of a metal wire 16c.

Reference numeral 18 designates a terminating resistor, and one end of the resistor 18 is grounded and the other end of the same is connected to the signal input electrode 12c by way of the metal wire 16a.

Reference numeral 20 designates a capacitive matching circuit, and the capacitive matching circuit 20 is shunt-connected to the one end 14e of the high-frequency electric circuit 14 by way of the metal wire 16e. In FIG. 14, those reference numerals which are the same as those employed in connection with the first embodiment designate the same or corresponding elements.

The capacitance of the capacitive matching circuit 20 according to the eleventh embodiment must be optimized such that, when the laser element 12 equipped with an optical modulator is viewed from the end 14e of the transmission line 14b, an impedance in the vicinity of a desired modulation frequency approaches a normalized impedance; i.e., the resistance of the terminating resistor 18.

In order to determine the capacitance of the capacitive matching circuit 20, the frequency characteristic of the semiconductor laser device 110 equipped with an optical modulator of the foregoing configuration is computed through simulation. The capacitance of the capacitive matching circuit 20 is determined such that the forward transmission characteristic of the semiconductor laser device 110 is improved while reflection attenuation in the vicinity of a modulation frequency is maximized, by means of insertion of the resistance matching correction circuit 112 between the optical modulator section 12b and the end 14e of the high-frequency electric circuit 14. After assembly of the semiconductor laser device 110 equipped with an optical modulator, the capacitance of the capacitive matching circuit 20 is finely adjusted while the frequency response characteristic of the semiconductor laser device 110 is measured, when necessary.

Specifically, the capacitance for improving the forward transmission characteristic is set such that parameter S21 representing a forward transmission characteristic at a frequency 20% higher than a predetermined modulation frequency falls within a range from parameter S21 of the modulation frequency to 3 dB this value.

The laser device 110 equipped with an optical modulator performs emission of a laser beam and modulation of intensity in the same manner as does the laser device 10 according to the first embodiment. In the first embodiment, the modulation characteristic of the laser device 10 has been improved through use of only the terminating resistance 18 and the capacitive matching circuit 20. Difficulty is encountered in determining the size of the capacitive matching circuit 20 and the position to which the capacitive matching circuit 20 is to be connected, thus consuming much time and effort for optimizing the laser device 10.

As indicated by parameter S11 shown in FIG. 2, at the time of optimization of the laser device 10 by means of inserting the capacitive matching circuit 20, the reflection attenuation in the vicinity of a modulation frequency is increased, thus improving the RF return loss characteristic of the laser device 10. However, parameter S21 representing a forward transmission characteristic is increased excessively in the vicinity of the modulation frequency or in a frequency range higher than the modulation frequency. Accordingly, as indicated by solid line (a) shown in FIG. 3, adjustment of capacitance of the capacitive matching circuit 20 to the appropriate volume of capacitance involves much time and effort. In some cases, optimization of the laser device 10 encounters difficulty.

In contrast, the eleventh embodiment is directed toward more readily improving the modulation characteristic of the laser device 110; for example, a reflection attenuation characteristic or the extinction ratio characteristic of a modulated optical waveform, by means of additionally providing the resistance matching correction circuit 112 to the laser device 110.

More specifically, impedance matching at d.c. or a comparatively low frequency is accomplished by means of the terminating resistor 18, and the resistance matching correction circuit 112 is placed in series between the one end 14e of the transmission line 14b and the signal input electrode 12c of the optical modulator section 12b, thereby increasing a reflection attenuation over the entire frequency range and improving the RF return loss characteristic of the laser device 110.

By reference to FIG. 2 relating to the first embodiment, it can be seen that the value of parameter S11 representing reflection attenuation moves in the direction in which the value becomes more negatively; that is, curve (b) designated by dotted lines in the graph of FIG. 2 moves downward.

Such a phenomenon results in mere attenuation of the signal, thereby deteriorating the transmission characteristic of the laser device 110. In other words, the forward transmission characteristic of the laser device 110 in the vicinity of the modulation frequency is deteriorated. By reference to FIG. 3 regarding the first embodiment, it can also be seen that the value of parameter S21 uniformly becomes smaller; namely, curve (b) designated by dotted lines moves downward. For this reason, the extinction ratio characteristic of the waveform of modulated light is deteriorated.

The capacitive matching circuit 20 is shunt-connected to the one end 14e of the high-frequency electric circuit 14. The capacitive matching circuit 20 improves the response of the laser device 110 in the vicinity of the modulation frequency and within a frequency range higher than the modulation frequency. By reference to FIG. 3, it can be seen that the capacitance of the capacitive matching circuit 20 is adjusted such that parameter S21 representing the forward transmission characteristic of the laser device 110 is increased, as indicated by solid line (a) shown in FIG. 3, when necessary. As a result, the resistance matching correction circuit 112 compensates for deterioration of the forward transmission characteristic of the laser device 10 in the vicinity of the modulation frequency and in the frequency range higher than the modulation frequency, thereby compensating for deterioration of the extinction ratio of a waveform of modulated light.

In the present embodiment, the laser diode 110 has both the capacitive matching circuit 20 and the resistance matching correction circuit 112. Therefore, the capacitance of the capacitive matching circuit 20 required for attaining a desired reflection attenuation and forward transmission characteristic can be made lower than that of the capacitive matching circuit 20 according to the first embodiment in which impedance matching is accomplished by use of only the capacitive matching circuit 20.

As the capacitance of the capacitive matching circuit 20 is increased, a ringing phenomenon arises in the waveform of modulated light, thus tending to deteriorate the waveform. In the eleventh embodiment, the capacitance of the capacitive matching circuit 20 can be made comparatively low, thus preventing deterioration of the waveform of modulated light.

As mentioned above, the semiconductor laser device 110 equipped with a modulator according to the eleventh embodiment enables easier adjustment of a modulation characteristic. Accordingly, a semiconductor laser device equipped with a modulator having a superior, consistently-attained modulation characteristic can be produced at high yield.

Figure 15:
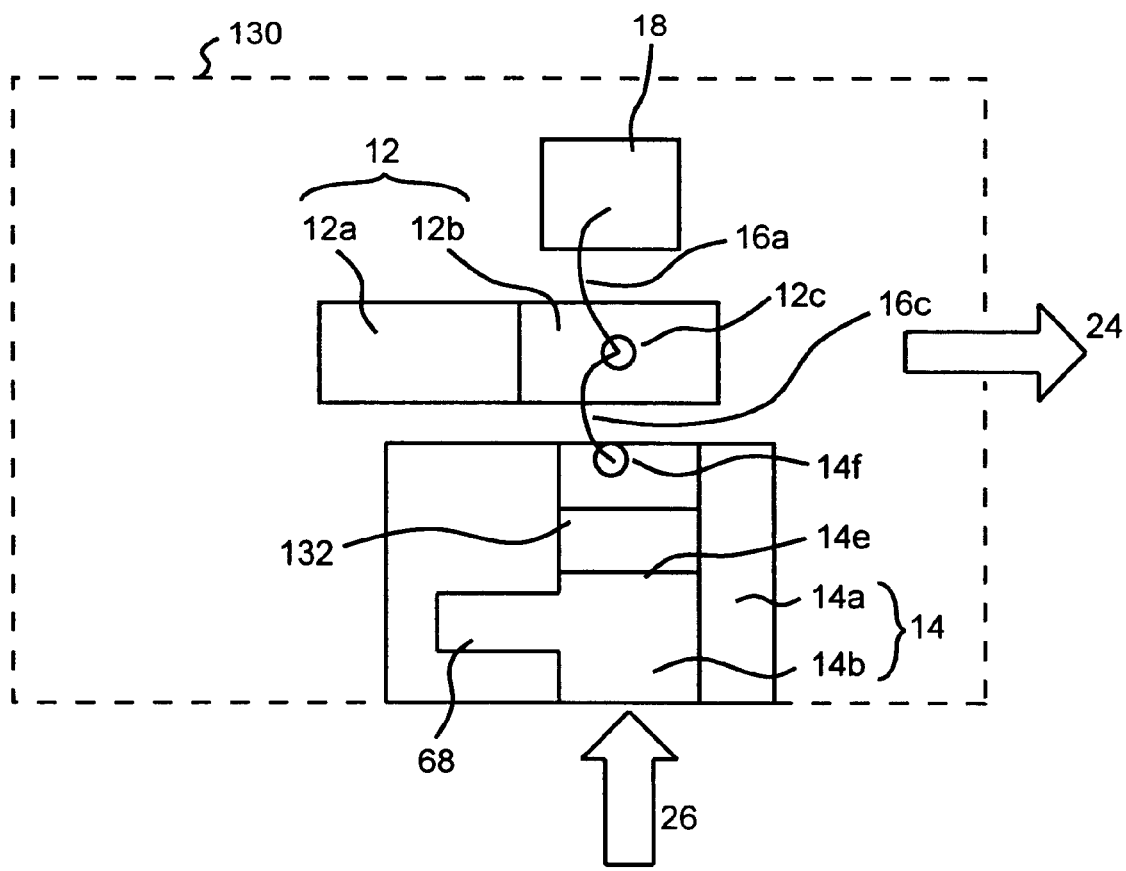
FIG. 15 is a plan view showing a more specific embodiment of the semiconductor laser device equipped with a modulator according to the eleventh embodiment.

FIG. 15 is a plan view showing a more specific embodiment of the semiconductor laser device equipped with a modulator according to the eleventh embodiment.

The capacitive matching circuit 20 is formed from the open stub 68 provided in proximity with the one end 14e of the transmission line 14b. The resistance matching correction circuit 112 is formed from a thin-film resistor 132 interposed between the one end 14e of the transmission line 14b and the point of connection 14f provided on the high-frequency substrate 14a. Reference numeral 130 designates a specific example semiconductor laser device equipped with a modulator.

Such a configuration of the semiconductor laser device enables simultaneous formation of the open stub 68 and the transmission line 14b and integrated formation of the thin-film resistor 132 on the high-frequency substrate 14a. Accordingly, there is achieved a reduction in the number of components of a semiconductor laser device, easy manufacture of a semiconductor laser device, and miniaturization of the same.

Although not described as a specific example in the present embodiment, any of the capacitors described in connection with the second through sixth embodiments may be used as the capacitive matching circuit 20 used in the present embodiment.

Twelfth Embodiment

Figure 16:
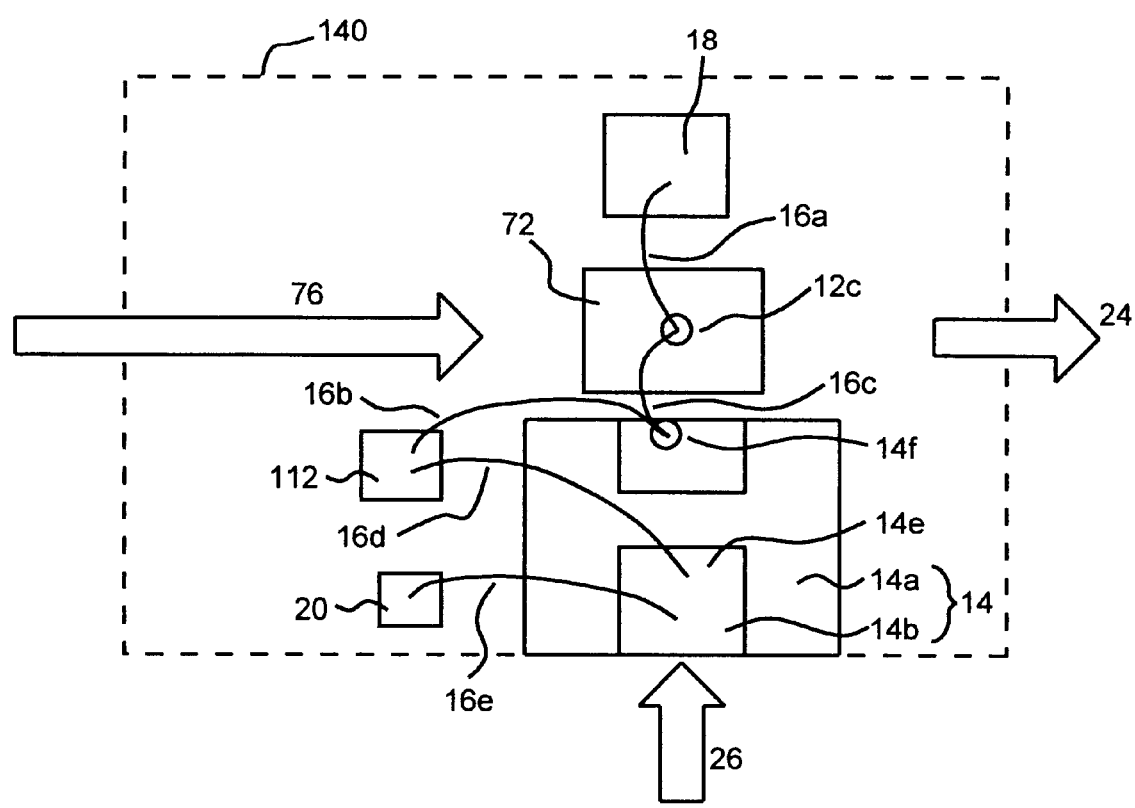
FIG. 16 is a plan view showing an optical modulator according to a twelfth embodiment of the present invention.

FIG. 16 is a plan view showing an optical modulator according to a twelfth embodiment of the present invention.

The optical modulator of the present embodiment improves the modulation characteristic of the optical modulator not through use of only a capacitive matching circuit, but prevents deterioration of a waveform of modulated light while a reflection attenuation is increased, by means of inserting a resistance matching correction circuit in series between the end of the high-frequency electric circuit and the optical modulator, to thereby attain a superior modulation characteristic.

In FIG. 16, reference numeral 140 designates an optical modulator. The one end 14e of the transmission line 14b is connected to the signal input electrode 12c of the optical modulator element 72 by way of the serially-connected resistance matching correction circuit 112.

One end of the resistance matching correction circuit 112 is connected to the one end 14e of the transmission line 14b by way of the metal wire 16d, and the other end of the resistance matching correction circuit 112 is connected to the point of connection 14f provided on the high-frequency substrate 14a. Further, the point of connection 14f is connected to the signal input electrode 12c of the optical modulator element 72 by way of the metal wire 16c.

Reference numeral 20 designates a capacitive matching circuit, and the capacitive matching circuit 20 is shunt-connected to the one end 14e of the high-frequency electric circuit 14 by way of the metal wire 16e. In FIG. 16, those reference numerals which are the same as those employed in connection with the eighth embodiment designate the same or corresponding elements.

In the optical modulator 140, the capacitive matching circuit 20 corresponds to, for example, a chip capacitor. The capacitive matching circuit 20 may correspond to any of the chip capacitors described in connection with the second, third, fourth, fifth, and sixth embodiments. As in the case of the eleventh embodiment, the resistance matching compensation circuit 112 may be formed from a thin-film resistor, and the capacitive matching circuit 20 may be formed from an open stub.

The optical modulator 140 having such a configuration operates in the same manner as does the optical modulator 70 according to the eighth embodiment. The capacitive matching circuit 20 and the resistive matching circuit 112 are adjusted in the same manner as described in connection with the semiconductor laser device 110 equipped with an optical modulator according to the eleventh embodiment. As a result, the modulation characteristic of the optical modulator 140 can be readily adjusted, and a modulator having a superior, consistently-attained modulation characteristic can be produced at high yield.

Thirteenth Embodiment

Figure 17:
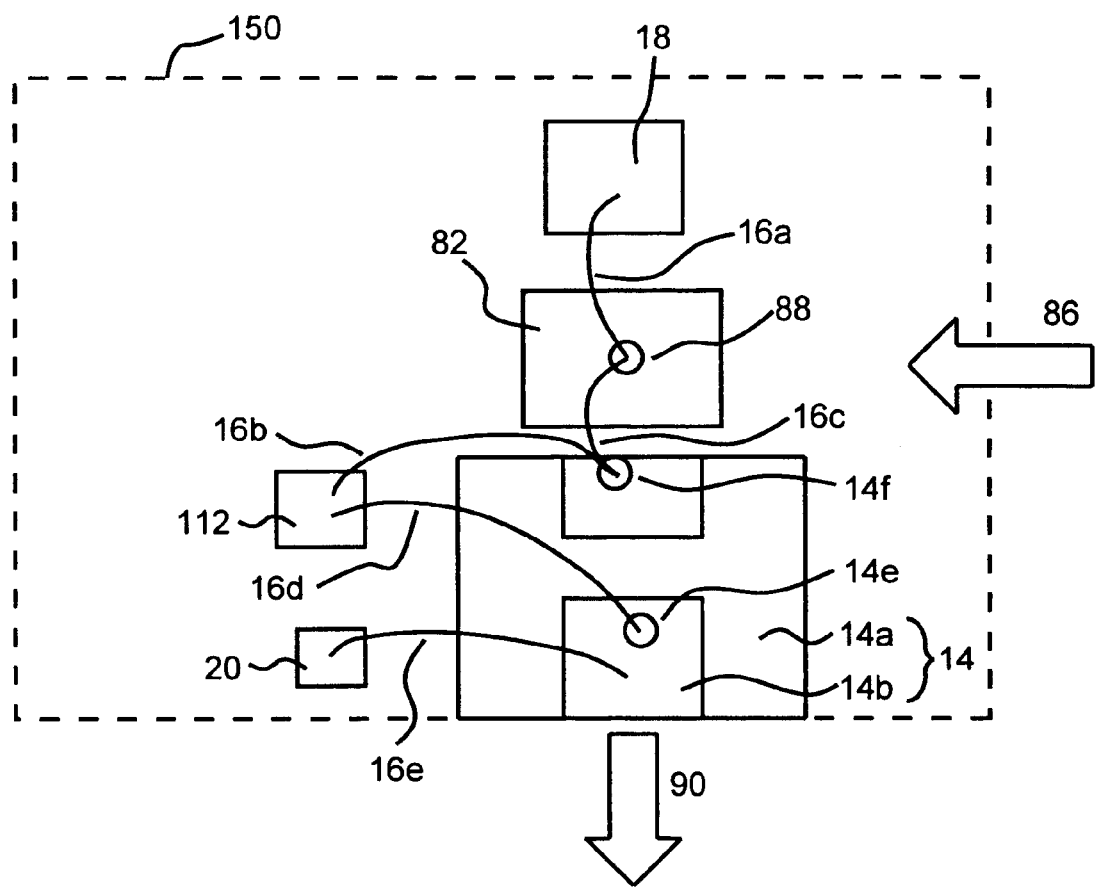
FIG. 17 is a plan view showing a photodiode device according to a thirteenth embodiment of the present invention.

FIG. 17 is a plan view showing a photo-diode device according to a thirteenth embodiment of the present invention.

The conversion characteristic of a photo-diode device according to the present embodiment is improved not by use of only a capacitive matching circuit. In addition to the capacitive matching circuit, a resistance matching correction circuit is placed in series between the end of a high-frequency electric circuit and a photo-diode, thereby increasing a reflection attenuation and improving the high-speed opto-electric conversion characteristic of the photo-diode device.

In FIG. 17, reference numeral 150 designates a photo-diode device. The one end 14e of the transmission line 14b is connected to a signal output electrode 88 of the photo-diode 82 by way of the serially-connected resistance matching correction circuit 112.

One end of the resistance matching correction circuit 112 is connected to the one end 14e of the transmission line 14b by way of the metal wire 16d, and the other end of the resistance matching correction circuit 112 is connected to the point of connection 14f provided on the high-frequency board 14a by way of the metal wire 16b. Further, the point of connection 14f is connected to the signal output electrode 88 of the photo-diode 82 by way of the metal wire 16c.

Reference numeral 20 designates a capacitive matching circuit, and the capacitive matching circuit 20 is shunt-connected to the end 14e of the high-frequency electric circuit 14 by way of the metal wire 16e.

In FIG. 16, those reference numerals which are the same as those employed in connection with the ninth embodiment designate the same or corresponding elements.

In the photo-diode device 150, the capacitive matching circuit 20 corresponds to, for example, a chip capacitor. The capacitive matching circuit 20 may correspond to any of the chip capacitors described in connection with the second, third, fourth, fifth, and sixth embodiments. As in the case of the eleventh embodiment, the resistance matching compensation circuit 112 may be formed from a thin-film resistor, and the capacitive matching circuit 20 may be formed from an open stub.

The photo-diode device 150 having such a configuration operates in the same manner as does the photo-diode device 80 according to the ninth embodiment. The capacitive matching circuit 20 and the resistive matching circuit 112 are adjusted in the same manner as described in connection with the semiconductor laser device 110 equipped with an optical modulator according to the eleventh embodiment. As a result, the modulation characteristic of the optical modulator 140 can be readily adjusted, a modulator having a superior, consistently-attained modulation characteristic can be produced at high yield.

Fourteenth Embodiment

The present embodiment is directed toward embodying the semiconductor laser device according to the eleventh embodiment through us of a flip-chip semiconductor laser device equipped with an optical modulator, thereby reducing variations in the inductance of wire connections.

Figure 18:
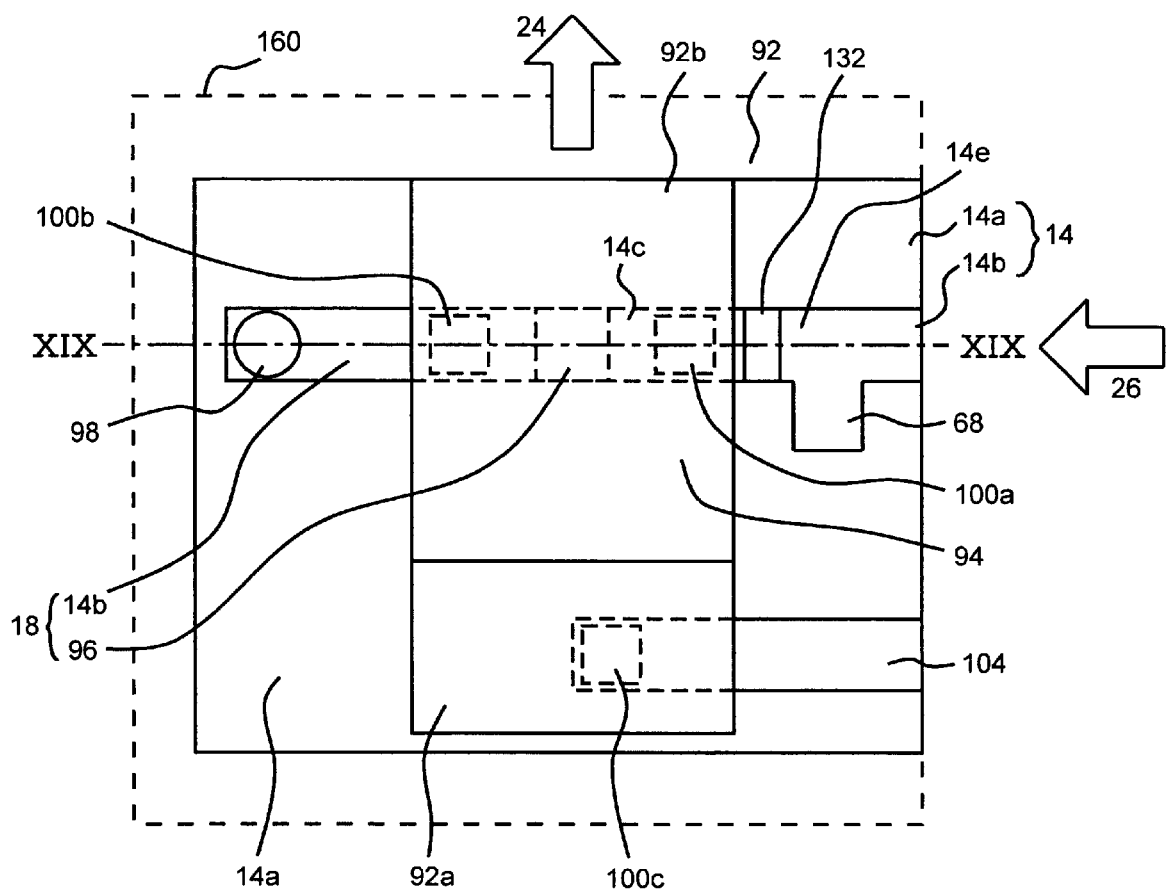
FIG. 18 is a plan view showing a flip-chip type semiconductor laser device equipped with an optical modulator according to the fourteenth embodiment.
Figure 19:
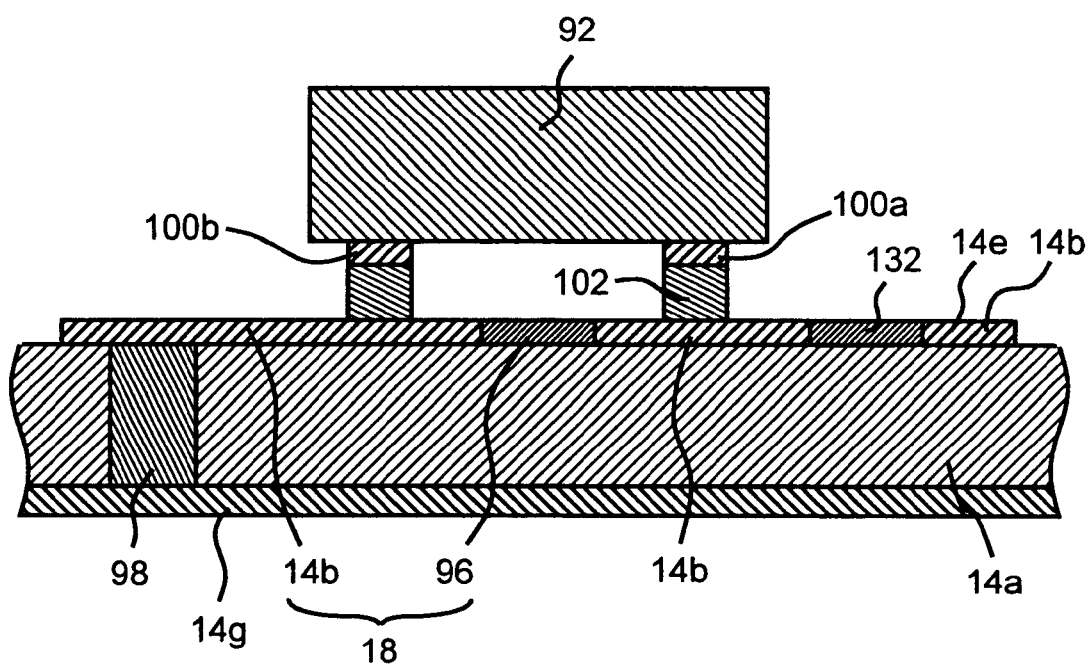
FIG. 19 is a cross-sectional view of the semiconductor laser device taken along line XIX—XIX shown in FIG. 18.

FIG. 18 is a plan view showing a flip-chip semiconductor laser device equipped with an optical modulator according to the fourteenth embodiment. FIG. 19 is a cross-sectional view of the semiconductor laser device taken along line XIX—XIX shown in FIG. 18.

The configuration of the semiconductor laser device shown in FIGS. 18 and 19 is substantially identical with that according to the tenth embodiment shown in FIGS. 12 and 13. The difference between the configuration of the semiconductor laser device according to the present embodiment and that according to the tenth embodiment lies in that in the present embodiment the open stub 68 is provided in the vicinity of the one end 14e of the signal-input-side transmission line 14b and that a thin-film resistor 132 is provided between the one end 14e and the signal input electrode 100a of the optical modulator section 92b. Reference numeral 160 designates a flip-chip semiconductor laser device equipped with a modulator, in which the high-frequency electric circuit 14 is embodied in the form of a micro-strip line.

In FIG. 18, the open stub 68 is provided on the high-frequency circuit substrate 14a and at a position in the vicinity of the one end 14e of the signal-input-side transmission line 14b to which the electric modulation signal 26 is applied. The thin-film resistor 132 serving as a resistance matching correction circuit is connected to the one end 14e of the transmission line 14b. The transmission line 14b extends farther byway of the thin-film resistor 132. The thus-extended portion of the transmission line 14b is connected to the portion of the transmission line 14b grounded by way of a through hole 98, by way of a thin-film resistor 96 of the terminating resistor 18.

The signal input electrode 100a of the optical modulator section 92b is connected, via the solder 102, to a position on the thus-extended portion of the signal-input-side transmission line 14b between the thin-film resistor 96 of the terminating resistor 18 and the thin-film 132 serving as a resistance matching correction circuit. Further, the ground electrode 100b of the optical modulator section 92b is connected, via the solder 102, to a position on the ground-side transmission line 14b between the thin-film resistor 96 of the terminating resistor 18 and the through-hole 98.

The laser input electrode 100c of the semiconductor laser section 92a is connected to the laser wiring layer 104 via the solder 102.

Here, the signal-input-side portion of the transmission line 14b and the ground-side portion of the transmission line 14b seem to be continuous. However, in practice, they are interconnected via the thin-film resistor 96 of the terminating resistor 18, and hence they are electrically separated from each other. For this reason, the edge of the signal-input-side portion of the transmission line 14b is taken as the one end 14e.

In the flip-chip semiconductor laser device 160 equipped with an optical modulator, the signal input electrode 100a and the ground electrode 100b are connected to the transmission line 14b of the high-frequency electric circuit 14 via the solder 102. In comparison with the case where the signal input electrode 100a and the ground electrode 100b are connected to the transmission line 14b via the metal wires 16, the inductance of connection conductors is lowered Further, in comparison with the case where the signal input electrode 100a and the ground electrode 100b are connected to the transmission line 14b via the metal wires 16, the parasitic capacitance of connection conductors becomes more stable, thereby resulting in a reduction in variations in capacitance.

Accordingly, a resultant semiconductor laser device attains a superior high-speed modulation characteristic and can be produced at high yield.

Figure 20:
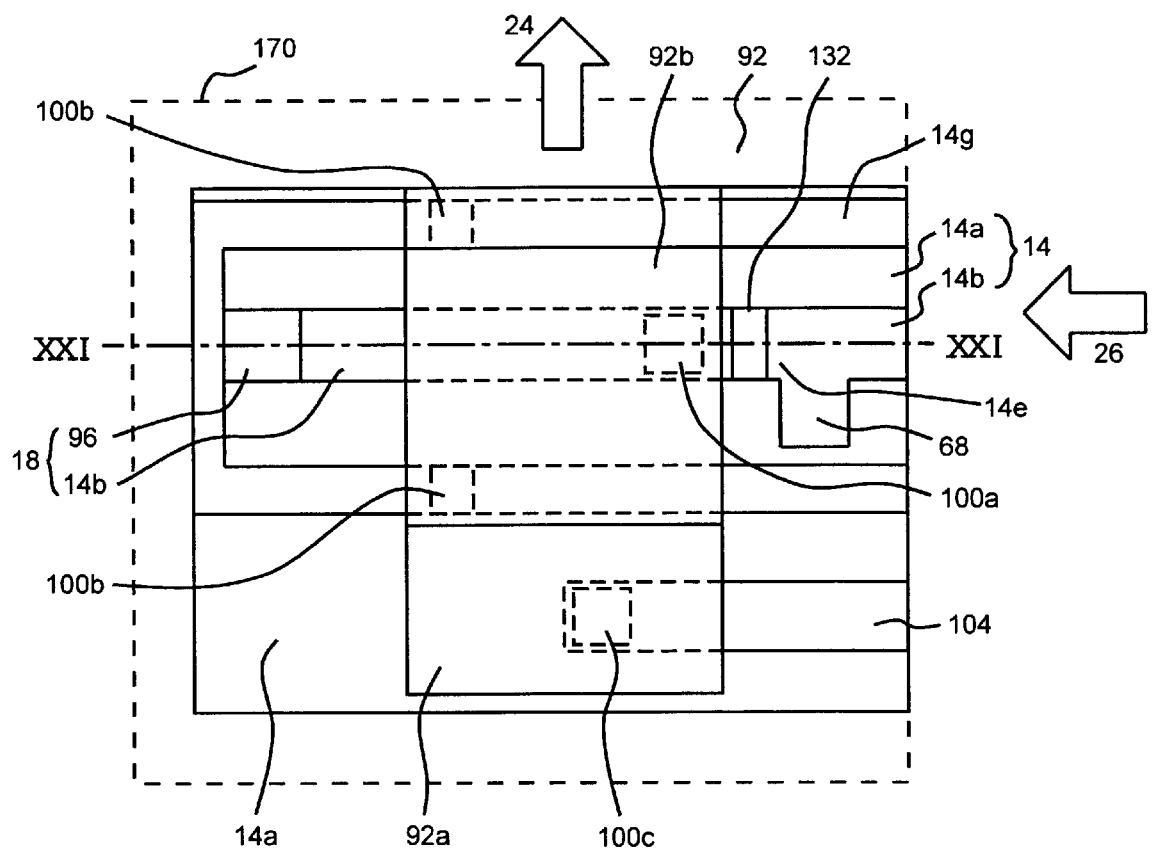
FIG. 20 is a plan view showing a semiconductor laser device equipped with an optical modulator, as a modification of the fourteenth embodiment.
Figure 21:
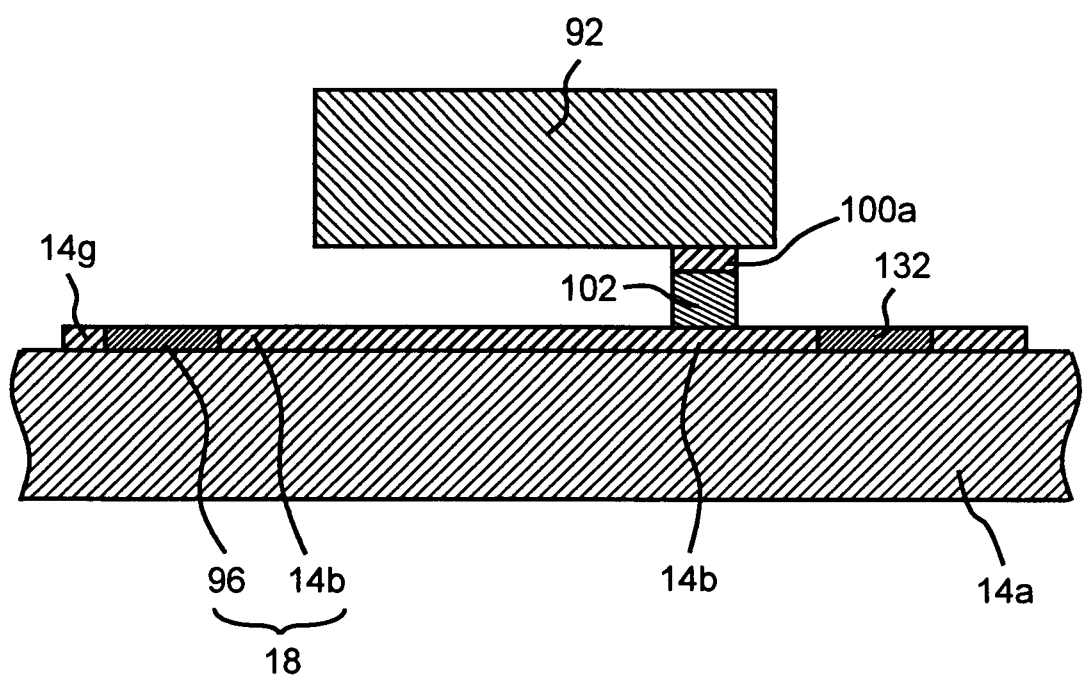
FIG. 21 is a cross-sectional view of the semiconductor laser device taken along line XXI—XXI shown in FIG. 20.

FIG. 20 is a plan view showing a semiconductor laser device equipped with an optical modulator, which is a modification of the fourteenth embodiment as described above. FIG. 21 is a cross-sectional view of the semiconductor laser device taken along line XXI—XXI shown in FIG. 20.

In contrast with the semiconductor laser device 160 shown in FIGS. 18 and 19 in which the high-frequency electric circuit 14 is embodied in the form of a micro-strip line, the semiconductor laser device is formed such that the high-frequency electric circuit 14 is embodied in the form of a coplanar line. Reference numeral 170 designates a semiconductor laser device equipped with an optical modulator, and 14g designates a ground line.

In addition to the advantage resulting from configuration of the semiconductor laser device 160; i.e., the high-frequency electric circuit 14 being embodied in the form of a micro-strip line, the semiconductor laser device 170 also yields an advantage of the thin-film resistor 96 of the terminating resistor 18 being disposed so as to avoid an overlap with the semiconductor laser element 92 having an optical modulator. Accordingly, the semiconductor laser element 92 becomes less susceptible to the influence of the heat produced by the thin-film resistor 96 of the terminating resistor 18, and stable operation of the semiconductor laser element 92 can be ensured, wherewith the reliability of the semiconductor laser device 160 can be improved.

Fifteenth Embodiment

The present embodiment is directed toward embodying the terminating resistor 18 employed in the fourteenth embodiment through use of a thin-film resistor and by means of disposing the thin-film resistor on the side surface of the high-frequency circuit substrate. The inductance component inherent to the terminating resistor is minimized, and variations in the inductance of wire connections are reduced, thereby producing at improved yield a semiconductor laser device with an optical modulator whose modulation characteristic exhibits little variation. The terminating resistor is disposed as far as possible from the semiconductor laser element, thereby minimizing the influence of the heat developing in the terminating resistor on the semiconductor laser element. Thus, stable operation of the semiconductor laser element having an optical modulator is ensured, whereby the reliability of the semiconductor laser element is improved.

Figure 22:
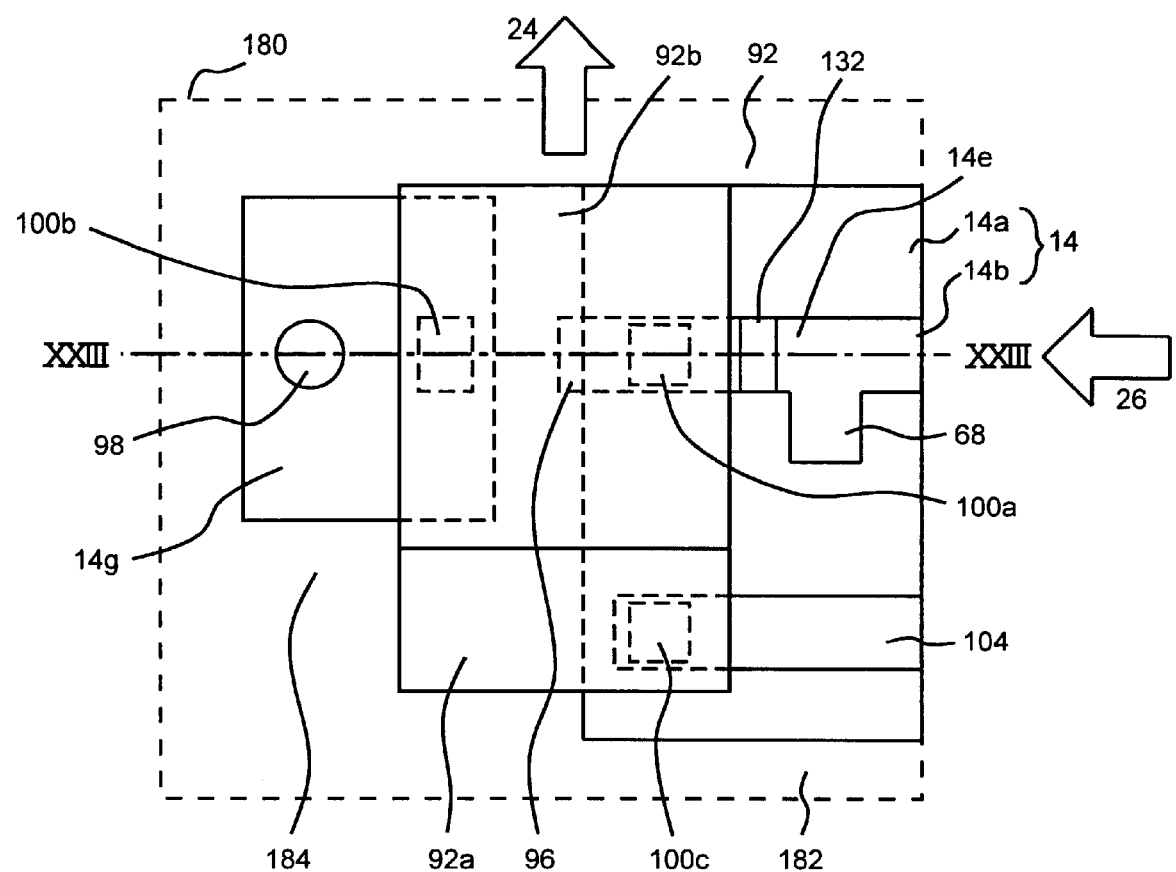
FIG. 22 is a plan view showing a flip-chip type semiconductor laser device equipped with an optical modulator according to the fifteenth embodiment.
Figure 23:
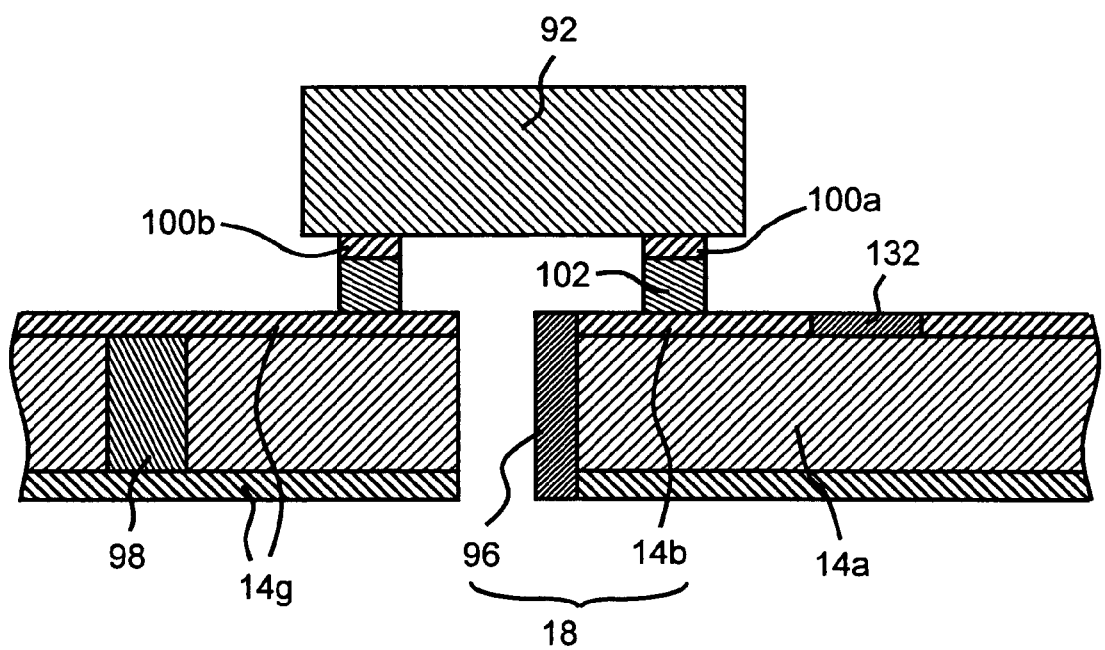
FIG. 23 is a cross-sectional view of the semiconductor laser device taken along line XXIII—XXIII shown in FIG. 22.

FIG. 22 is a plan view showing a flip-chip semiconductor laser device equipped with an optical modulator according to the fifteenth embodiment. FIG. 23 is a cross-sectional view of the semiconductor laser device taken along line XXIII—XXIII shown in FIG. 22. A micro-strip line is employed as a high-frequency electric circuit.

In FIG. 22, reference numeral 180 designates a flip-chip semiconductor laser device having an optical modulator; 182 designates a signal-side high-frequency electric circuit; and 184 designates a ground-side high-frequency electric circuit. The signal-side high-frequency electric circuit 182 is separated from and disposed opposite the ground-side high-frequency electric circuit 184.

In the signal-side high-frequency electric circuit 182, the signal-input-side transmission line 14b for receiving the electric modulation signal 26 extends over the high-frequency circuit substrate 14a. The open stub 68 is provided in the vicinity of the one end 14e of the transmission line 14b. The one end 14e of the transmission line 14b is connected to the thin-film resistor 132 serving as a resistance matching correction circuit, and an extended portion of the transmission line 14b is connected to the transmission line 14b by way of the thin-film resistor 132.

The ground lines 14g are provided on the surface side and the rear side of the ground-side high-frequency electric circuit 184, and the ground lines 14g are interconnected via the through hole 98.

In the flip-chip semiconductor laser element 92 having an optical modulator, the signal input electrode 100a of the optical modulator section 92b is interposed, by means of the solder 102, between the thin-film resistor 96 of the signal-side high-frequency electric circuit 182 and the thin-film resistor 132 serving as a resistance matching correction circuit. Further, the ground electrode 100b of the optical modulator section 92b is connected to the ground line 14g provided on the surface of the ground-side high-frequency electric circuit 184 by way of the solder 102.

The laser input electrode 100c is connected to the laser wiring layer 104 laid on the high-frequency circuit substrate 14a of the signal-side high-frequency electric circuit 182, by way of the solder 102.

In the flip-chip semiconductor laser device 180 having an optical modulator, the signal input electrode 100a, the thin-film resistor 96 serving as a terminating resistor is provided on the side of the high-frequency circuit substrate 14a, and hence the inductance of the terminating resistor; i.e., the inductance of the thin-film resistor 96, is reduced. Further, in contrast with the case where the terminating resistor is connected to the high-frequency circuit substrate by way of a metal wire, the parasitic capacitance of connections becomes stable, whereby variations in the capacitance to be adjusted are reduced. Accordingly, a semiconductor laser device having a superior high-speed modulation characteristic can be produced at high yield.

As indicated by the configuration employed in the fourteenth embodiment shown in FIG. 18, in a case where the thin-film resistor 96 is provided on the surface of the high-frequency circuit substrate 14a as a terminating resistor and where the high-frequency circuit substrate 14a is formed from a micro-strip line, the thin-film resistor 96 must be provided between the signal input electrode 100a and the ground electrode 100b of the optical modulator section 92b. Further, the thin-film resistor 96 must be provided very close to the optical modulator section 92b.

In the fifteenth embodiment, the thin-film resistor 96 is provided on the side surface of the high-frequency circuit substrate 14a, thereby ensuring a large distance between the thin-film resistor 96 and the optical modulator section 92b. The optical modulator section 92b becomes less susceptible to the influence of the heat produced by the thin-film resistor 96 serving as a terminating resistor. Accordingly, the stable operation of the semiconductor laser element 92 equipped with an optical modulator can be ensured, wherewith the reliability of the semiconductor laser 180 can be improved.

Figure 24:
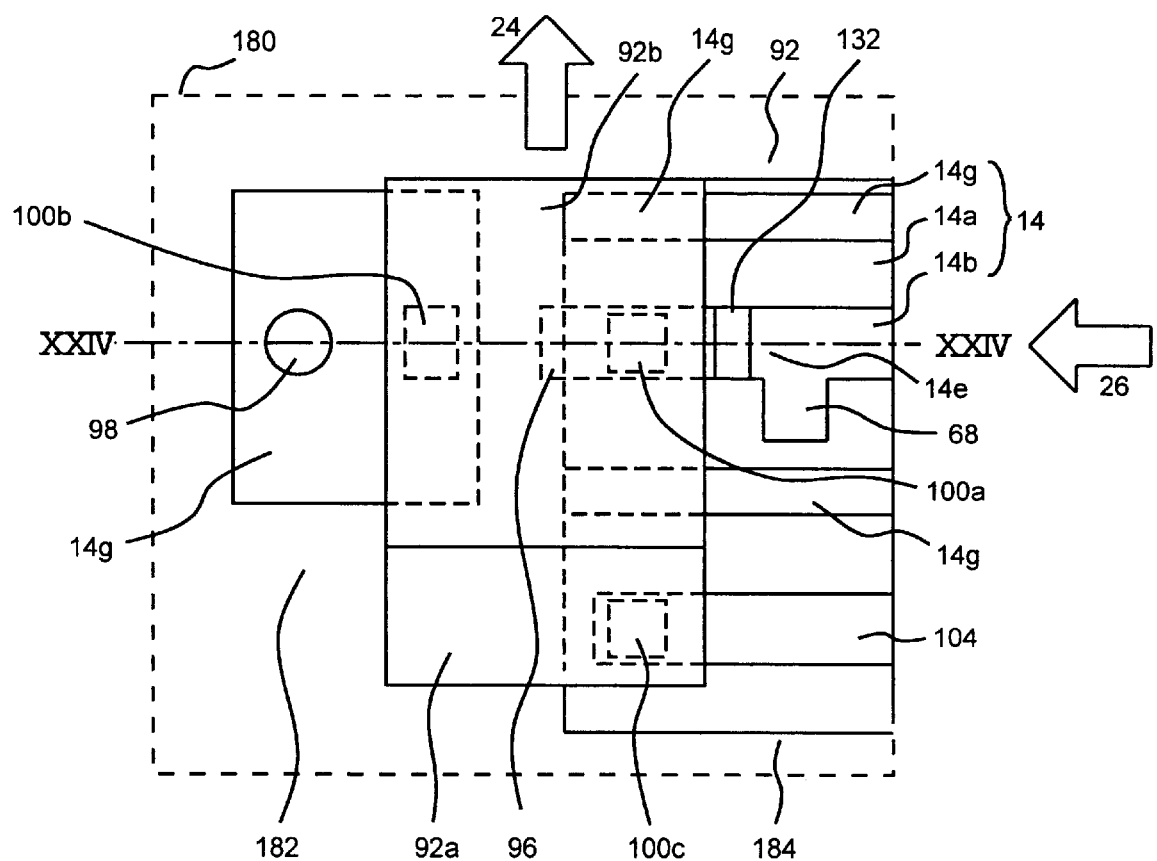
FIG. 24 shows a flip-chip type semiconductor laser device having an optical modulator of different configuration according to the fifteenth embodiment.
Figure 25:
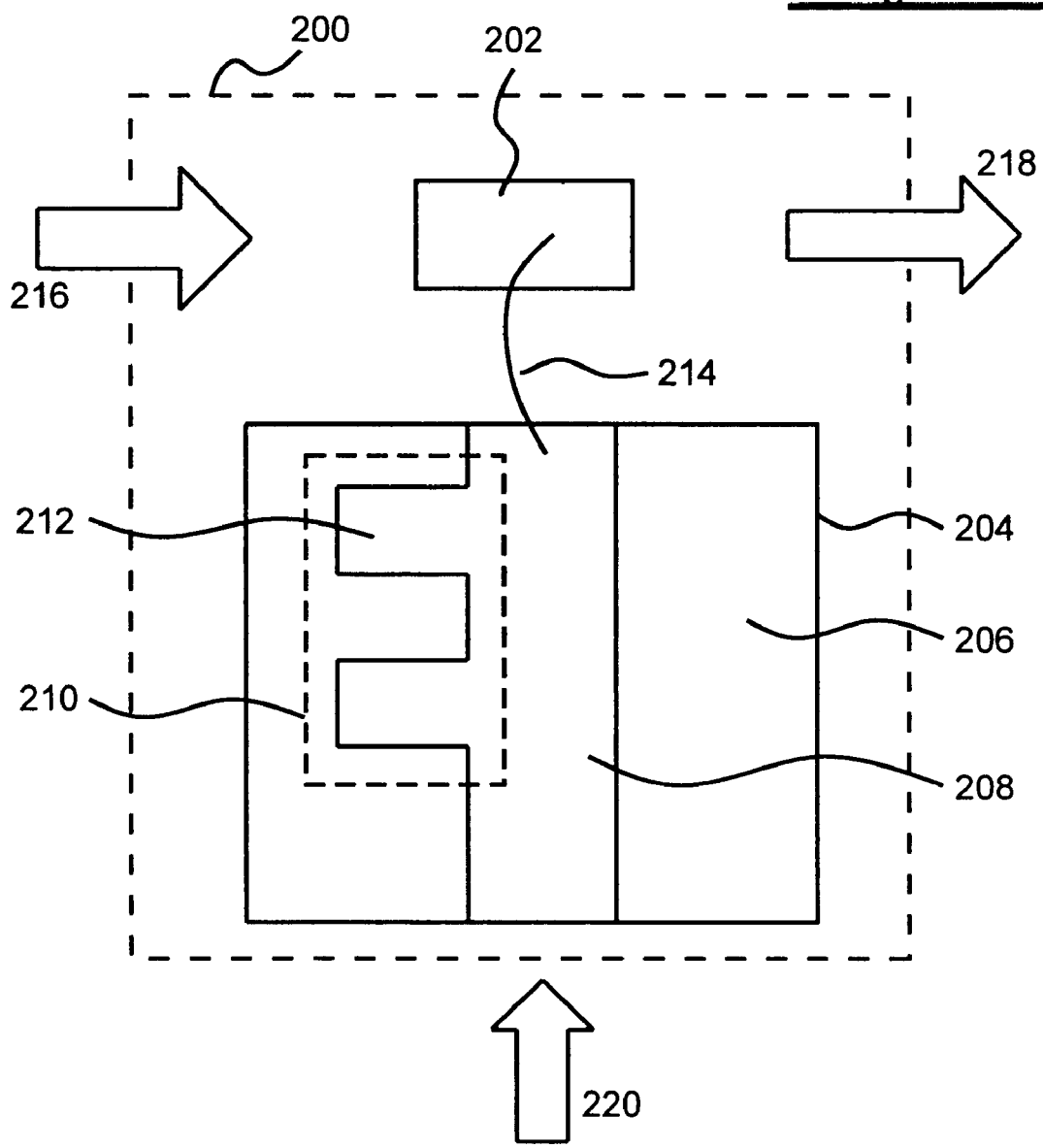
FIG. 25 is a plan view showing an example of a conventional optical modulator.

FIG. 24 shows a flip-chip semiconductor laser device having an optical modulator of different configuration according to the fifteenth embodiment, in which the signal-side high-frequency electric circuit 182 is formed from a coplanar line.

The flip-chip semiconductor laser device differs in configuration from the flip-chip semiconductor laser device shown in FIG. 22 in that the signal-input-side transmission line 14b provided on the high-frequency circuit substrate 14a is sandwiched between the ground lines 14g. A cross-section of the semiconductor laser device taken along line XXIV—XXIV shown in FIG. 24 is identical with that shown in FIG. 23.

In terms of a reduction in the inductance of the terminating resistor 96, the semiconductor laser device yields the same advantage as that yielded by the semiconductor laser device having the configuration according to the fourteenth embodiment shown in FIG. 20. Even in the case where a coplanar line is used for forming the high-frequency electric circuit, the semiconductor laser element 92 can be offset so as to avoid on overlap with the thin-film resistor 96 serving as a terminating resistor, depending on the geometry of the coplanar line. In contrast, regardless of the geometry of the coplanar line, the configuration of the semiconductor laser device shown in FIG. 24 enables a reduction in the influence of the heat produced by the terminating resistor, i.e., the thin-film resistor 96. Particularly, the present invention yields an advantage of an increase in degree of freedom in design of a circuit configuration for application to a high-frequency circuit whose impedance changes greatly according to the geometry of the circuit.

Although the present invention has been described by taking a semiconductor laser device with an optical modulator as a flip-chip opto-electric conversion semiconductor device, the present invention can be applied to configuration of an optical modulator or a light-receiving element. Even in such a case, the same advantage as that yielded in the previous embodiments can be attained.

The opto-electric conversion semiconductor device according to the present invention is embodied in any of the foregoing configurations. The features and the advantages of the present invention may be summarized as follows.

According to one aspect, in an opto-electric conversion semiconductor device, a semiconductor element for opto-electric conversion of a signal is provided. A high-frequency electric signal circuit has one end positioned which is in proximity with the semiconductor element and is connected to an electric signal terminal by way of a conductor. The location on the one end is positioned closest to the electric signal terminal of the semiconductor element, and is taken as a point of connection. A resistive matching circuit is connected at one end to the semiconductor element by way of a conductor and is connected at other end to the electric signal terminal. A capacitive matching circuit is connected to the point of connection provided on the one end of the high-frequency electric signal circuit and whose impedance is determined such that the impedance of the semiconductor element relative to the point of connection becomes identical with the normalized impedance of the resistive matching circuit.

As a result, the reflection attenuation and cut-off frequency of the opto-electric conversion semiconductor device can be increased over a wide frequency range from d.c. to a modulation frequency. Consequently, there can be assembled an opto-electric conversion semiconductor device which achieves a superior modulation characteristic over a wide frequency range from d.c. to a modulation frequency.

In another aspect, the semiconductor element may be an optical modulator element. As a result, the reflection attenuation and cut-off frequency of the optical modulator element can be increased over a wide frequency range from d.c. to a modulation frequency. Consequently, there can be assembled an optical modulator element which attains a superior modulation characteristic over a wide frequency range from d.c. to a modulation frequency.

In another aspect, the semiconductor element may be an optical modulator integrated semiconductor laser element, and the electric signal terminal of the semiconductor element is provided in an optical modulator section of the optical modulator integrated semiconductor laser element. As a result, the reflection attenuation and cut-off frequency of the optical modulator integrated semiconductor laser device can be increased over a wide frequency range from d.c. to a modulation frequency. Consequently, there can be assembled an optical modulator integrated semiconductor laser device which attains a superior modulation characteristic over a wide frequency range from d.c. to a modulation frequency.

In another aspect, the semiconductor element may be a light-receiving element. As a result, the reflection attenuation and cut-off frequency of the light-receiving element can be increased over a wide frequency range from d.c. to a modulation frequency. Consequently, there can be assembled a light-receiving device which attains a superior modulation characteristic over a wide frequency range from d.c. to a modulation frequency.

In another aspect, the semiconductor element may be a flip-chip semiconductor element. In contrast with a case where the electrode of the semiconductor element is connected to the transmission line by way of a metal wire, the electrode of the semiconductor element is provided close to the end of the transmission line. Further, in contrast with a case where the electrode of the semiconductor element is connected to the transmission line by way of a metal wire, the parasitic capacitance of the semiconductor element becomes more stable, and variations in the capacitance to be adjusted by the capacitive matching circuit are reduced. As a result, the opto-electric conversion semiconductor device can be produced at high yield.

In another aspect, the conductor may be a conductor line or wire. Accordingly, the present invention can be applied to a current semiconductor element without involvement of modifications to the specification of the semiconductor element. Consequently, an opto-electric conversion semiconductor device having a superior modulation characteristic can be produced at low cost.

In another aspect, the capacitive matching circuit may be a chip capacitor. The capacitive matching circuit becomes easy to mount. Consequently, an opto-electric conversion semiconductor device having a superior modulation characteristic can be produced at low cost.

In another aspect, the chip capacitor may be a chip capacitor whose capacitance can be adjusted. The capacitance of the chip capacitor required for accomplishing impedance matching can readily be finely adjusted. Consequently, the modulation characteristic of the opto-electric conversion semiconductor device can be optimized, thereby improving the yield of the opto-electric conversion semiconductor device.

In another aspect, the capacitive matching circuit may be an open stub provided on the end of the high-frequency electric signal circuit. The transmission line and the open stub can be formed integrally, thereby reducing the number of components. Consequently, an opto-electric conversion semiconductor device having a superior modulation characteristic can be produced inexpensively.

In another aspect, the open stub may be an open stub whose capacitance can be adjusted. The capacitance of the open stub required for accomplishing impedance matching can readily be and finely adjusted. Consequently, the modulation characteristic of the opto-electric conversion semiconductor device can be optimized, thereby improving the yield of the opto-electric conversion semiconductor device.

According to another aspect, in an opto-electric conversion semiconductor device, a semiconductor element is provided which has an electric signal terminal and effects opto-electric conversion of a signal. A high-frequency electric signal circuit is provided which has one end positioned in proximity with the semiconductor element. A resistive matching circuit is connected at one end to the semiconductor element by way of a conductor and is grounded at other end. A resistance matching correction circuit is provided between the electric signal terminal and the end of the high-frequency electric signal circuit by way of a conductor. A capacitive matching circuit is connected to the end the high-frequency electric signal circuit and whose impedance is determined such that the impedance of the semiconductor element relative to the end in the vicinity of a desired frequency range becomes identical with the normalized impedance of the resistive matching circuit. As a result, an increased reflection attenuation and an improved opto-electric signal conversion characteristic can be attained. Further, an opto-electric conversion semiconductor device having a consistently-attained opto-electric signal conversion characteristic can be produced at high yield.

In another aspect, the semiconductor element may be an optical modulator element. As a result, the reflection attenuation of the optical modulator is increased, and the high-frequency circuit can be readily adjusted such that there is attained a superior modulation characteristic for preventing deterioration of waveform of a modulated light. Therefore, an optical modulator having a superior, consistently-attained modulation characteristic can be produced at high yield.

In another aspect, the semiconductor element may be an optical modulator integrated semiconductor laser element, and the electric signal terminal of the semiconductor element is provided in an optical modulator section of the optical modulator integrated semiconductor laser element. Therefore, an optical modulator integrated semiconductor laser device having a superior, consistently-attained modulation characteristic can be produced at high yield.

In another aspect, the semiconductor element may be a light-receiving element. As a result, the reflection attenuation of the opto-electric conversion semiconductor device is increased, and a high-speed opto-electric conversion characteristic can be attained, thus enabling easy adjustment of a high-frequency circuit. Therefore, a light-receiving devices having a superior, consistently-attained opto-electric conversion characteristic can be produced at high yield.

In another aspect, the semiconductor element may be a flip-chip semiconductor element. In contrast with a case where the electrode of the semiconductor element is connected to the transmission line by way of a metal wire, the electrode of the semiconductor element is provided closer to the end of the transmission line. Further, in contrast with a case where the electrode of the semiconductor element is connected to the transmission line by way of a metal wire, the parasitic capacitance of the semiconductor element becomes more stable, and variations in the capacitance to be adjusted by the capacitive matching circuit are reduced. As a result, an opto-electric conversion semiconductor device can be produced at high yield.

In another aspect, the capacitive matching circuit may be an open stub provided in the vicinity of the end of the high-frequency electric signal circuit. The transmission line and the open stub can be formed integrally, thereby reducing the number of components. Consequently, an opto-electric conversion semiconductor device having a superior modulation characteristic can be produced at low cost.

In another aspect, the resistance matching correction circuit may be a thin-film resistor provided in the vicinity of the end of the high-frequency electric signal circuit. Consequently, an opto-electric conversion semiconductor device having a superior modulation characteristic can be produced at low cost.

In another aspect, the resistive matching circuit may be a thin-film resistor provided on the side surface of a circuit substrate constituting the high-frequency electric signal circuit. As a result, there can be ensured a large distance between the semiconductor element and the resistor of the resistive matching circuit. There can be produced a highly-reliable opto-electric conversion semiconductor device which is less susceptible to the influence of the heat produced by the resistive matching circuit and which operates stably.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 11-323812, filed on Nov. 15, 1999 and a Japanese Patent Application No. 12-063195, filed on Mar. 8, 2000 including specification, claims, drawings and summary, on which the Convention priority of the present application is based, are incorporated herein by reference in its entirety.

What is claimed is:

1. An opto-electric conversion semiconductor device comprising:
    a semiconductor element for opto-electric conversion of a signal, said semiconductor element having an signal input electrode;
    a high-frequency electric signal circuit having one end positioned in proximity with said semiconductor element; said high-frequency electric signal circuit having a connection point in said one end at a location closest to said signal input electrode of said semiconductor element, said connection point being connected to said signal input electrode of said semiconductor element by way of a conductor;

a resistive matching circuit connected to said signal input electrode at one end and to ground at the other end;

a capacitive matching circuit connected to said connection point of said high-frequency electric signal circuit, said capacitive matching circuit having an adjusted impedance such that an impedance at said connection point towards said semiconductor element is same with a normalized impedance of said resistive matching circuit.

2. The opto-electric conversion semiconductor device according to claim 1, wherein said semiconductor element comprises an optical modulator element.

3. The opto-electric conversion semiconductor device according to claim 1, wherein said semiconductor element comprises an integrated semiconductor laser element equipped with an optical modulator, and said signal input electrode of said semiconductor element is provided in said optical modulator.

4. The opto-electric conversion semiconductor device according to claim 1, wherein said semiconductor element comprises a photo sensitive element.

5. The opto-electric conversion semiconductor device according to claim 1, wherein said semiconductor element comprises a flip-chip type semiconductor element.

6. The opto-electric conversion semiconductor device according to claim 1, wherein said conductor comprises a conductor line.

7. The opto-electric conversion semiconductor device according to claim 1, wherein said capacitive matching circuit comprises a chip capacitor.

8. The opto-electric conversion semiconductor device according to claim 7, wherein said chip capacitor is a chip capacitor whose capacitance can be adjusted.

9. The opto-electric conversion semiconductor device according to claim 1, wherein said capacitive matching circuit comprises an open stub provided on said one end of said high-frequency electric signal circuit.

10. The opto-electric conversion semiconductor device according to claim 9, wherein said open stub comprises an open stub whose capacitance can be adjusted.

11. An opto-electric conversion semiconductor device comprising:

a semiconductor element for opto-electric conversion of a signal, said semiconductor element having a signal input electrode;

a high-frequency electric signal circuit having one end positioned in proximity with said semiconductor element;

a resistive matching circuit connected to said electric signal terminal by way of a conductor at one end and to ground at the other end;

a resistance matching correction circuit connected between said signal input electrode and said one end of said high-frequency electric signal circuit by way of a conductor; and a capacitive matching circuit connected to said one end of said high-frequency electric signal circuit, said capacitive matching circuit having an adjusted impedance such that an impedance at said one end towards said semiconductor element is same with a normalized impedance of said resistive matching circuit in the vicinity of a desired frequency range.

12. The opto-electric conversion semiconductor device according to claim 11, wherein said semiconductor element comprises an optical modulator element.

13. The opto-electric conversion semiconductor device according to claim 11, wherein said semiconductor element comprises an integrated semiconductor laser element equipped with an optical modulator, and said signal input electrode of said semiconductor element is provided in said optical modulator.

14. The opto-electric conversion semiconductor device according to claim 11, wherein said semiconductor element comprises a photo sensitive element.

15. The opto-electric conversion semiconductor device according to claim 11, wherein said semiconductor element comprises a flip-chip type semiconductor element.

16. The opto-electric conversion semiconductor device according to claim 11, wherein said capacitive matching circuit comprises an open stub provided in the vicinity of said one end of said high-frequency electric signal circuit.

17. The opto-electric conversion semiconductor device according to claim 11, wherein said resistance matching correction circuit comprises a thin-film resistor provided in the vicinity of said one end of said high-frequency electric signal circuit.

18. The opto-electric conversion semiconductor device according to claim 11, wherein said resistive matching circuit comprises a thin-film resistor provided on a side surface of a substrate of said high-frequency electric signal circuit.

* * * * *